(12) United States Patent
Betts et al.

(10) Patent No.: US 11,823,698 B2
(45) Date of Patent: Nov. 21, 2023

(54) AUDIO CROPPING

(71) Applicant: Audiotelligence Limited, Cambridgeshire (GB)

(72) Inventors: David Anthony Betts, Cambridgeshire (GB); James Peter McTavish, Oxford (GB); Joe Patrick Lynas, Cambridgeshire (GB)

(73) Assignee: AUDIOTELLIGENCE LIMITED, Cambridgeshire (GB)

( * ) Notice: Subject to any disclaimer, the term of this patent is extended or adjusted under 35 U.S.C. 154(b) by 0 days.

(21) Appl. No.: 17/384,292

(22) Filed: Jul. 23, 2021

(65) Prior Publication Data

US 2021/0358514 A1    Nov. 18, 2021

Related U.S. Application Data

(63) Continuation-in-part of application No. 16/631,990, filed on Jan. 17, 2020, now Pat. No. 11,354,536.

(51) Int. Cl.
*G10L 21/0272* (2013.01)
*H04S 7/00* (2006.01)
(Continued)

(52) U.S. Cl.
CPC ........ *G10L 21/0272* (2013.01); *G06F 3/0484* (2013.01); *H03H 17/02* (2013.01);
(Continued)

(58) Field of Classification Search
None
See application file for complete search history.

(56) References Cited

U.S. PATENT DOCUMENTS 6,430,528 B1    8/2002  Jourjine
9,338,420 B2 *  5/2016  Xiang ............... G11B 27/28
(Continued)

FOREIGN PATENT DOCUMENTS

EP  WO-2019166278 A1 *  9/2019  ......... H04M 1/6016
GB  2548325 A             9/2017
(Continued)

OTHER PUBLICATIONS

Nesta Francesco et al, "Convolutive Underdetermined Source Separation through Weighted Interleaved ICA and Spatio-temporal Source Correlation", Mar. 12, 2012 (Mar. 12, 2012), Network and Parallel Computing; [Lecture Notes in Computer Science; Lect.Notes Computer], Springer International Publishing, Cham, pp. 222-230, XP047371392, ISBN: 9783642175718, ISSN:0302-9743, p. 222, paragraph 1.—p. 226, paragraph 2.2, p. 228, paragraph 5.
(Continued)

*Primary Examiner* — Duc Nguyen
*Assistant Examiner* — Assad Mohammed
(74) *Attorney, Agent, or Firm* — TAROLLI, SUNDHEIM, COVELL & TUMMINO L.L.P.

(57) ABSTRACT

A method of cropping a portion of an audio signal captured from a plurality of spatially separated audio sources in a scene, the method comprising: capturing the audio signal with one or more recording devices; separating the audio signal into a plurality of components each associated with one or more of the plurality of audio sources; selecting a spatial region in the scene; determining which of the plurality of components are associated with an audio source positioned outside of the selected spatial region; and cropping the plurality of components associated with an audio source positioned outside of the selected spatial region out of the audio signal.

22 Claims, 10 Drawing Sheets

(51) Int. Cl.
*H04R 1/40* (2006.01)
*H04R 3/00* (2006.01)
*H03H 17/02* (2006.01)
*G06F 3/0484* (2022.01)
*H04N 5/262* (2006.01)

(52) U.S. Cl.
CPC .......... *H04N 5/2628* (2013.01); *H04R 1/406* (2013.01); *H04R 3/005* (2013.01); *H04S 7/30* (2013.01); *H04R 2430/03* (2013.01); *H04S 2400/15* (2013.01)

(56) References Cited

U.S. PATENT DOCUMENTS

| | | | |
|---|---|---|---|
| 9,668,066 | B1 | 5/2017 | Betts |
| 2011/0261977 | A1 | 10/2011 | Hiroe |
| 2015/0117649 | A1 | 4/2015 | Nesta |
| 2015/0206541 | A1 | 7/2015 | Qi |
| 2015/0281839 | A1* | 10/2015 | Bar-On ............... G10L 21/0272 381/71.7 |
| 2015/0365628 | A1* | 12/2015 | Ben-Bassat ............ H04N 7/144 348/14.1 |
| 2016/0029120 | A1 | 1/2016 | Nesta |
| 2016/0125893 | A1 | 5/2016 | Le Magoarou |
| 2017/0098444 | A1 | 4/2017 | Song |
| 2017/0186442 | A1 | 6/2017 | Cahill |
| 2018/0115853 | A1* | 4/2018 | Lehtiniemi ............ G06F 3/165 |
| 2018/0176508 | A1* | 6/2018 | Pell .................... H04L 65/4015 |
| 2018/0299527 | A1* | 10/2018 | Helwani ................ H04R 1/406 |
| 2019/0007780 | A1 | 1/2019 | Sheaffer |
| 2020/0068297 | A1* | 2/2020 | Rollow, IV ............ H04R 3/005 |

FOREIGN PATENT DOCUMENTS

| | | |
|---|---|---|
| WO | 0117109 A1 | 3/2001 |
| WO | WO-2019166278 A1 * | 9/2019 .......... H04M 1/6016 |

OTHER PUBLICATIONS

Yusuke Mizuno et al, "Fast source separation based on selection of effective temporal frames", Signal Processing Conference (EUSIPCO), 2012 Proceedings of the 20th European, IEEE,Aug. 27, 2012 (Aug. 27, 2012), p. 914-918, XP032254486, ISBN: 9781467310680, p. 914, paragraph 1.—p. 917, paragraph 3.1; figure 2.

Francesco Nesta et al, "A Flexible Spatial Blind Source Extraction Framework for Robust Speech Recognition in Noisy Environments", Vancouver, Canada Jun. 1, 2013 (Jun. 1, 2013), p. 33-38, Retrieved from the Internet: URL:http://spandh.dcs.shef.ac.uk/chime_workshop/papers/pP3_nesta.pdf, XP055161460 [retrieved on Jan. 12, 2015], p. 33, paragraph 2.—p. 36, paragraph 5.; figure 1.

International Search Report for International Application No. PCT/GB2017/052124 dated Oct. 20, 2017.

International Search Report and Written Opinion issued in connection with corresponding PCT Patent Application No. PCT/EP2022/070260 dated Nov. 11, 2022.

Nikunen, et al., "Object-based Modeling of Audio for Coding and Source Separation Link to publication Tutcris Portal".

Zhao, et al., "The Sound of Pixels", Pattern Recognition: 5th Asian Conference, ACPR 2019, Auckland, New Zealand, Nov. 26-29, 2019, Revised Selected Papers, Part II; Lecture Notes in Computer Science, Springer International Publishing, Cham, XP047635263, pp. 587-604, Oct. 6, 2018.

* cited by examiner

AUDIO CROPPING

RELATED APPLICATIONS

This application is a continuation-in-part application of U.S. patent application Ser. No. 16/631,990 filed on 17 Jan. 2020 entitled "ACOUSTIC SOURCE SEPARATION SYSTEMS"; the entire contents of which are hereby incorporated by reference.

TECHNICAL FIELD OF THE INVENTION

This invention relates to a method and audio-visual system for cropping a portion of an audio-signal captured from a plurality of spatially separated audio sources in a scene.

BACKGROUND TO THE INVENTION

Blind Audio Source Separation (BSS) is a technique that takes a multi-microphone audio signal and, without any knowledge of the acoustic scene or the microphone geometry, separates the audio into its constituent sources.

WO/2019/016494 describes techniques for BSS. By way of example, consider the acoustic scene of FIG. 1. This comprises four sources $s_1$-$s_4$ with respective audio channels $h_1$-$h_4$ to a recording device, for example a microphone array 10 comprising (in this example) 8 microphones. The aim is to demix the microphone signals to make estimates of the original sources—that is to perform Blind Source Separation or Blind Signal Separation (BSS). We assume minimal information about the sources and the microphone locations. In some applications of BSS, the microphone array may be placed on a table or chair in a social setting or meeting and BSS may be used to separate a desired source, such as a person speaking, from undesired sounds such as other speakers and/or extraneous noise sources.

Using the multi-channel observations x, the example task is to design a multi-channel linear filter w to create source estimates y.

$$\underline{y}_t = \Sigma_\tau w_\tau \underline{x}_{t-\tau} \quad (1)$$

We will assume that there are M microphones/sensors/input channels and S audio sources. In practice there may be more sensors than sources, in which case it is desirable effectively to reduce the number of sensors ("dimension reduction") so that, for example, a real source is not split across two different reconstructed sources. If the number of sources is greater than the number of sensors this may either be ignored or, more preferably, frames where the extraneous sources are absent are pre-selected for processing.

We first describe conversion to the time-frequency domain, then independent component analysis for blind source separation and various additional techniques.

STFT Framework

We process the audio in the time-frequency domain. There are many ways of transforming time domain audio samples to and from the time-frequency domain and the techniques we describe can be applied inside any such framework. In this illustrative example, we employ Short Time Fourier Transforms (STFTs). In multi-channel audio, the STFTs are applied to each channel separately.

Within this framework we define:
M is the number of microphones.
S is the number of sources, and we assume S M.
F is the number of STFT frequencies.
T is the number of STFT frames.

In the STFT domain, the source estimate convolution eq(1) becomes a matrix multiplication.

At each frequency we have the M×T observation matrix $X_f$, and an unknown demixing matrix $W_f$ such that the demixed output $Y_f$ is given by $$Y_f = W_f X_f \quad (2)$$

Here the demixed output $Y_f$ is a S×T matrix where s labels sources, and the demixing matrix $W_f$ is a S×M matrix. Equivalently, in the description below we refer to a vector of observations of length M, $\underline{x}_{ft}$ (the input audio data in the time-frequency domain), and to a demixed output vector of length S, $\underline{y}_{ft}$ (the demixed output audio data in the time-frequency domain). Thus:

$$\underline{y}_{ft} = W_f \underline{x}_{ft} \quad (3)$$

ML-ICA

Maximum likelihood independent component analysis, ML-ICA is a frequency-domain ICA algorithm that can be applied to the problem of blind source separation.

ML-ICA operates in the STFT domain on the multi-channel time-frequency observations $\underline{x}_{ft}$ to calculate a set of de-mixing matrices W, one per frequency. Here multi-channel refers to the multiple (acoustic) sensor channels, typically microphones, and "frequency" is short for "frequency channel". The multi-channel observations are stored in a T×F frame buffer X. As new frames are received, the frame buffer can be updated and the de-mixing matrices re-calculated.

Thus for each frequency, ML-ICA designs a demixing matrix $W_f$ such that the separated outputs are given by $$\underline{y}_{ft} = W_f \underline{x}_{ft}$$

The de-mixed outputs represent the original audio sources up to a permutation and scaling ambiguity which may be solved separately.

The ML-ICA log likelihood for each frequency is given by $$L(X_f; W_f) = \sum_{t=1}^{T} L(\underline{x}_{ft}; W_f)$$

$$L(\underline{x}_{ft}; W_f) = const + \left(\ln \det W_f W_f^H - |\underline{y}_{ft}|_1\right)$$

(This assumes that the demixed output y is drawn from a Laplace distribution; the subscript "1" indicates the L1 norm).

The objective is to find $W_f$ that maximises the likelihood.

As we are operating in the complex domain we use the Wirtinger derivative $\nabla L$. Define sign( . . . ) as the element wise complex sign operator. We then have $$\nabla L = \sum_{t=1}^{T} \left(2 W_f^{-H} - \text{sign}(\underline{y}_{ft}) \underline{x}_{ft}^H\right)$$

We do this by iteratively updating the estimate of $W_f$ using the natural gradient. The natural gradient is the steepest ascent of L when projected onto an appropriate Riemannian manifold. In the present case we use the manifold of invertible matrices and the natural gradient $\delta W_f$ is given by $$\delta W_f \propto \nabla L W_f^H W_f$$

With a step size of $$\frac{\mu_k}{2T}$$

for each iteration we got $$W_f \leftarrow W_f + \frac{\mu_k}{2T}\nabla L W_f^H W_f = W_f + \mu_k\left(W_f^{-H} - \frac{1}{2T}\sum_{t=1}^{T}\text{sign}(\underline{y}_{ft})\underline{x}_{ft}^H\right)W_f^H W_f$$

$$= \left((1+\mu_k)I - \frac{\mu_k}{2T}\sum_{t=1}^{T}\text{sign}(\underline{y}_{ft})\underline{y}_{ft}^H\right)W_f$$

For each frequency, ML-ICA performs the following algorithm:
1. Initialise $W_f$
2. For each iteration $k \in 1:K$
   a. calculate $\underline{y}_{ft}=W_f\underline{x}_{ft}$ for each frame.
   b. $G = \frac{1}{2T}\Sigma_t \, \text{sign}(\underline{y}_{ft})\underline{y}_{ft}^H$
   c. $W_f \leftarrow ((1+\mu_k)I - \mu_k G)W_f$ The algorithm has converged when G=I. Here and later G is a gradient value related to the gradient of the cost function, and closely related to the natural gradient. The number of iterations K can be either be fixed or we can use a convergence criterion such as $\|I-G\|_F^2 < \epsilon$ (where F denotes the Frobenius norm).

Any rank S matrix can be used to initialise $W_f$. In the absence of any prior information, a good candidate is to use principal component analysis and initialise $W_f$ to the S most significant components. It will be appreciated that the algorithm is used for each frequency f to determine the set of demixing matrices W.

The main computational burden is steps 2a and 2b which are each O(SMT).

The factor of ½ in calculating G only affects the scaling of the final result and may be ignored in implementations.

The expression of the step size of $$\frac{\mu_k}{2T}$$

in terms of T is merely tor mathematical convenience. The step size may be changed (reduced) from one iteration to the next, but this is not necessary; in practice a fixed value of µ=0.5 has been found to work well.

Importance Weighting

Not all frames have equal value. For example an important source may only have a few frames where it's active, or some frames may be corrupted by an unimportant source such as a door slam. Recent frames may be considered more relevant than older ones, though this is not necessarily the case. The system may therefore weight the frames according to their importance (to the particular problem/application), and this can improve the quality of the source separation.

Assuming we have a process that can identify appropriate weights for each frame $\lambda_t$ ($\lambda_t \geq 0$) we can reformulate the ML-ICA using $$L(X_f; W_f) = const + \sum_t \lambda_t\left(\ln \det W_f W_f^H - |\underline{y}_{ft}|_1\right)$$

Without loss of generality, we can assume $\Sigma_t\lambda_t=1$ (analogous to probability, although summing to 1 is not a requirement, because we only need to find $W_f$ that maximises the likelihood).

The natural gradient algorithm for each frequency then becomes:
1. Initialise $W_f$
2. For each $k \in 1:K$
   a. calculate $\underline{y}_{ft}=W_f\underline{x}_{ft}$ for each frame.
   b. $G = \frac{1}{2}\Sigma_t \lambda_t \, \text{sign}(\underline{y}_{ft})\underline{y}_{ft}^H$
   c. $W_f \leftarrow ((1+\mu_k)G)W_f$ Here the sum over t is over all T frames. The convergence criterion are the same as for standard ML-ICA (and setting $$\lambda_t = \frac{1}{T}$$

gives unweighted ML-ICA as previously described). Optionally the weights may also vary across frequency as well as across frames. Some example techniques for assigning the weights are described later.

Stochastic Gradient-Based Improvements

A stochastic gradient ascent (or descent) method can be used to improve the performance of the procedure.

Where stochastic gradient ascent (or descent) is used 'on-line', for each new frame received, the gradient $\nabla L$ is approximated by the gradient with respect to that fame. For the example of ML-ICA this leads to $$\nabla L \approx \lambda_t(W_f^{-H} - \tfrac{1}{2}\text{sign}(y_{ft})x_{ft}^H)$$

The algorithm is then
1. Initialise $W_f$
2. For each frame
   a. $\underline{y}_{ft}=W_f\underline{x}_{ft}$.
   b. $G' = \frac{1}{2}\lambda_t \, \text{sign}(\underline{y}_{ft})\underline{y}_{ft}^H$
   c. $W_f \leftarrow ((1+\mu)I - \mu G')W_f$ Note that here G' is determined from data for a single frame (typically the latest frame) rather than by summing data derived from multiple frames. Thus t refers to the time of the latest frame and the procedure relies upon an approximation to $\nabla L$ rather than the "true" value obtain by summing over all the frames.

Importance Subsampled Stochastic Gradient ICA (ISSG-ICA)

We now describe an improvement that uses importance subsampled stochastic gradient ICA. In this technique we use importance sampling to (randomly) choose a group of frames with respective probabilities $\lambda_t$ in order to estimate $W_f$ in a more computationally efficient manner (i.e. with less computation, as contrasted with improving the convergence rate).

Let R be a random process that will choose frame t with probability $\lambda_t$.

1. Initialise $W_f$
2. For each $k \in 1:K$
   a. Use R to choose $L_k$ frames
   b. For each chosen frame $\underline{y}_{ft} = W_f \underline{x}_{fR(l)}$
   c. $G' = \frac{1}{2L_k} \Sigma_l \, \text{sign}(\underline{y}_{fl}) \underline{y}_{fl}^H$
   d. $W_f \leftarrow ((1 + \mu_k)I - \mu_k G')W_f$ In step (c) the sum is over the $L_k$ chosen frames defined by the random process R. The subscript k implies that L may (but need not be) different from one iteration k to another. For example $L_k$ may be adjusted between iterations to maximise the expected convergence of the procedure.

For each iteration one can show that the expected value of G' given $W_f$ is the same as G from the importance weighted ICA algorithm, which thus validates the procedure.

$$E\{G'; W_f\} = \frac{1}{2} \sum_t \lambda_t \text{sign}(\underline{y}_{ft}) \underline{y}_{ft}^H$$

Under a fairly weak set of assumptions, the procedure can be shown to converge in the mean to a maximum of the importance weighted objective function (thus, broadly speaking, to a best fit of the demixing to the observations).

The main computational burden is steps 2b and 2c which are each $O(S^2 L_k)$.

The efficiency comes because
- On each iteration $L_k$ can be much less than T (although more iterations may be required)
- There are no multiplications by $\lambda_t$ in calculating G'
- The cost of choosing from R can be amortised across all frequencies (assuming that the weights are invariant across frequency)—that is, the same random choice of frames may be used for each of the frequencies.

For uniform weights, R can be replaced with a process of choosing $L_k$ frames from T, to avoid unnecessarily computing the update for duplicate chosen frames. In practice this also works with non-uniform weights, but it introduces a bias towards the uniform weighted solution as $L_k$ approaches T.

Tuning $L_k$

One can use a training data set, optionally from a variety of environments, to tune $L_k$. The objective is to achieve good performance in as computationally efficient manner as possible.

To achieve this one way is to start by looking at the first iteration and choosing a value $L_1$ which gives the best aggregate increase in performance per computation. Having fixed $L_1$ one goes on to choose $L_2$ and so forth. To speed up the tuning process, one can increment the number of iterations in steps of 5 rather than one at a time. The exact values for $L_k$ will depend upon the microphone array and the desired performance.

As an example, using an 8 channel microphone array, an experiment found that weighted ML-ICA needed 30 iterations of 120 frames to achieve a target performance. After tuning, the stochastic gradient version only needed 15 iterations at $L_k=20$ followed by 25 iterations at $L_k=28$ to give equivalent performance. This result is a factor of 3 reduction in computational load compared with weighted ML-ICA.

Scaling for stability

One can exploit the scaling and permutation ambiguity of the procedure to improve the stability of the algorithm, and to facilitate the use of a fixed step size parameter $\mu$. Pre-scaling $W_f$ to maximise the likelihood can be performed efficiently in a way that can be rolled into the ICA update equations. However, we propose pre-scaling to minimise the substitute cost function $\lambda \|I-G\|_F^2$. We define a substitute cost function as one whose minimisers correspond to the stationary points of the original equation.

Note that in our case $\mu^2 \|I-G\|_F^2$ corresponds to the norm of the ICA step in the associated Riemannian manifold. It is generally a better indicator of how close we are to the optimum than the likelihood. It is not always possible to directly minimise $\|I-G\|_F^2$, however in the case of pre-scaling it can also be done efficiently in a way that can be rolled into the ICA update equations. Consequently pre-scaling to minimise $\|I-G\|_F^1$ can give us better convergence characteristics and stability than pre-scaling to maximise the likelihood.

There are two versions of pre-scaling; diagonal and scalar rescaling. Both can use a fixed step size, for example $\mu \approx 0.5$, and give good convergence stability. Both versions have an additional cost of $O(S^2)$ which is small compared to the rest of the algorithm.

We will demonstrate the scaling algorithm using ISSG-ICA, but pre-scaling can also be applied in a similar manner to ML-ICA, weighted ML-ICA, and in other approaches.

Diagonal Rescaling

If we analyse the effect of pre-scaling $W_f$ by a non-negative real diagonal matrix C, we have $W_f \leftarrow CW_f$ $\underline{y}_{ft} \leftarrow C\underline{y}_{ft}$ $G' \leftarrow G'C$ One can therefore calculate G' without pre-scaling and then minimise $\|I-G'C\|_F^2$ a with respect to the diagonal elements of C. Noting that the diagonal elements of G' are non-negative real, and we obtain $$C_{ii} = \frac{G'_{ii}}{(G'^H G')_{ii}}$$

The update algorithm for each frequency becomes:
1. Initialise $W_f$
2. For each $k \in 1:K$
   a. Use R to choose a subset of $L_k$ frames
   b. For each chosen frame $\underline{y}_{ft} = W_f \underline{x}_{fR_f(l)}$
   c. $G' = \frac{1}{2L} \Sigma_l \, \text{sign}(\underline{y}_{fl}) \underline{y}_{fl}^H$
   d. For each i: $C_{ii} = \frac{G'_{ii}}{(G'^H G')_{ii}}$
   e. $W_f \leftarrow ((1 + \mu)I - \mu G'C)CW_f$ Scalar Resealing Minimising $\|I-G'C\|_F^2$ with respect to a scalar C gives $$C = \frac{tr(G')}{tr(G'^H G')}$$

Other than the calculation of C the algorithm is the same as the diagonal version.

The diagonal version is most useful when there is a significant volume imbalance between the input channels. It can therefore be useful to use diagonal rescaling for the first few iterations then switch to scalar rescaling, which is slightly more computationally efficient.

If the input data has already been normalised in some fashion, for example as part of a dimension reduction step, the diagonal rescaling may be redundant.

Dimension Reduction

It will be noted that in the case that there are fewer sources than microphones, the ML-ICA algorithm is constrained to the subspace defined by the initial estimate of $W_f$.

As an optional alternative, the technique of dimension reduction can be used. In dimension reduction, the input data is projected onto a sub space, for example using principal component analysis (PCA), and ICA is applied to the projected data. The simplest form of dimension reduction is to discard microphones but PCA is better (reduced distortion) and may be employed by setting the M×S projection matrix $D_f$ to the set of eigenvectors corresponding to the largest eigenvalues of $X_f X_f^H$.

Thus where the number of sources is less than the number of microphones the microphone observations $x_f$ may be pre-processed by a multichannel linear filter $D_f$ which has fewer rows than columns:

$$X'_f = D_f^H X_f$$

A square S×S ICA matrix $W'_f$ can then be calculated from $X'_f$ using any of the ML-ICA algorithms described earlier and applied to this projected data $$Y_f = W'_f X'_f$$

Thus the original demixing matrix is found by $$W_f = W'_f D_f^H$$

The two methods are mathematically equivalent, but in general dimension reduction is more computationally efficient. Non-square ICA can be advantageous if:

1. The total frame set is very large, and the stochastic subsampled ICA is unlikely to access a given frame more than once over all iterations or
2. The compute architecture is vectorised so that the non-square matrix multiplications come for free. (e.g. a 5×5 matrix/vector product is no more efficient than a 5×8 matrix/vector product).

Frame Selection/Weighting

A separate process to the blind source separation process can be used to obtain metadata about the sources present, for example in captured frames stored in a frame buffer as described later. Such metadata may include information such as the source activity envelopes and location information: it is generally an easier problem to obtain this data than to perform the blind source separation (BSS).

The basic principle is to use this metadata to calculate an 'importance' value for each frame. We describe below some examples of heuristics which may employ frame metadata to determine an importance metric for a frame; one or more of these approaches may be used separately or in combination. Where a relative importance is defined ('lower' or 'higher'), this may be relative to an average value of an importance metric for the frames.

a) Frames that contain loud impulsive events like door slams may be assigned a relatively lower importance metric.
b) Frames that are very quiet may be assigned a relatively lower importance metric as they are unlikely to contain useful information for BSS.
c) Older frames may be assigned a relatively lower importance metric.
d) In a case where there are more sources present than the BSS procedure can separate (i.e. more sources than sensors), one or more of the following techniques may be used:

The sources may be classified into "required" and "extraneous" sources. Here "required" refers to a source being required for the purposes of separating a target source from other sources which may either be other potential target sources or one or more sources of interference. Thus a source of interference may be required in the blind source separation procedure so that it can be "tuned out", that is separated from one or more other sources present. By contrast an extraneous source is one which is not required either as a target source or as a source of interference to remove: It is often better to concentrate on separating the relevant sources and ignore the extraneous ones. Including the extraneous sources in the BSS problem can damage how well the relevant sources are separated, whereas excluding them simply means that a filtered version of the extraneous sources will be present on each output. Excluding the extraneous sources is generally the more palatable option, although clearly perfect exclusion is not always possible. A source may be classified into "required" and "extraneous" based on, for example, one or more of the following:

i. Prior information such as a user selected/specific location
  ii. Identification of a source as a commonly occurring loud source (e.g. a steady fan noise) may be used to define a source as "required"
  iii. Identification of a source as a recently occurring source may be used to define a source as "required" (the most recently occurring sources are most likely to be active again in future)

Once a classification has been made frames that contain one or more required sources may be given a higher important metric than frames that contain one or more extraneous sources.

e) The contribution of (required) sources may be equalised: without equalisation a commonly occurring source will have more influence in the BSS algorithm than an infrequent one.

Once importance metric values or weights have been allocated to the frames the procedure can then use the importance values in updating a frame buffer storing past frames (see below). In particular, rather than overwriting the oldest frames, the procedure can instead choose to overwrite the unimportant frames (that is, a frame with less than a threshold value of importance metric and/or a stored frame with a lower importance metric than the new, incoming frame). This allows the system to make maximum use of the frame buffer to record history relevant to the source separation problem. Preferably, once the frame buffer has been updated, the importance values are recalculated.

Scaling Ambiguity

In the above-described procedure, we may extract the source estimates up to an arbitrary diagonal scaling matrix $B_f$. This is an arbitrary filter, since there is a value of $B_f$ at each frequency (this can be appreciated from the consideration that changing the bass or treble would not affect the independence of the sources). The arbitrary filter can be removed by considering what a source would have sounded like at a particular microphone.

In one approach, conceptually the scaling ambiguity can be resolved by taking one source, undoing the effect of the demixing to see what it would have sounded like at one or more of the microphones, and then using the result to adjust the scaling of the demixing matrix to match what was actually received (heard)—that is, applying a minimum distortion principle. However although this is what is taking place conceptually we only require knowledge of the demixing matrix and it is not necessary to actually undo the effect of the demixing.

The procedure can estimate the sources as received at the microphones using a minimum distortion principle as follows:

Let $\hat{W}_f$ be a combined demixing filter including any dimension reduction or other pre processing.

Let $\hat{W}_f^{\dagger}$ be the pseudo inverse of $\hat{W}_f$. This is a minimum distortion projection from the source estimates back to the microphones.

Let $S(s)$ be a selector matrix which is zero everywhere except for one element on the diagonal $S(s)_{ss}=1$.

To project source estimate s back to all the microphones we use $$W'_f(s) = \hat{W}_f^{\dagger} S(s) \hat{W}_f \quad (25)$$

$$\hat{Y}_f(s) = W'_f(s) X_f \quad (26)$$

Matrix $S(s)$ selects one source s, and equations (25) and (26) define an estimate for the selected source on all the microphones. In equation (26) $\hat{Y}_f(s)$ is an estimate of how the selected source would have sounded at microphones, rather than an estimate of the source itself, because the (unknown) room transfer function is still present.

Frequency Permutation

In another technique, the input signals are split into frequency bands and each frequency band is treated independently, and the results at different frequencies are then aligned. Thus in a matrix $W_f$ each row corresponds to a source, and the rows of the matrices $W_f$ for the frequencies concerned are permuted with the aim that a particular row always corresponds to the same source (row 1=source 1 and so forth).

The skilled person will be aware of many published techniques for resolving the permutation ambiguity. For example, in one approach this may be done by assuming that when a source is producing power at one frequency it is probably also active at other frequencies.

Source Selection

Oftentimes it is only a subset of the sources that is desired. Because there may be a global permutation, it can be useful to estimate which of the sources are the desired ones—that is, the sources have been separated into independent components but there is still ambiguity as to which source is which (e.g. in the case of a group of speakers around a microphone, which source s is which speaker). In addition in some examples, the procedure operates on time slices of the audio (successive groups of STFT frames) and it is not guaranteed that the "physical" source labelled as, say, s=1 in one group of frames will be the same "physical" source as the source labelled as s=1 in the next group of frames (this depends upon the initialisation of W, which may, for example, be random or based on a previous group of frames).

Source selection may be made in various ways, for example on the basis of voice (or other audio) identification, or matching a user selected direction. Other procedures for selecting a source include selecting the loudest source (which may comprise selecting a direction from which there is most power); and selecting based upon a fixed (predetermined) direction for the application. For example a wanted source may be a speaker with a known direction with respect to the microphones. A still further approach is to look for a filter selecting a particular acoustic source which is similar to a filter in an adjacent time-frequency block, assuming that similar filters correspond to the same source. Such approaches enable a consistent global permutation matrix (P) to be determined from one time-frequency block to another.

In some examples, to match a user-selected direction, knowledge of the expected microphone phase response $\theta_{jf}$ from the indicated direction may be employed. This can either be measured or derived from a simple anechoic model given the microphone geometry relative to an arbitrary origin. A simple model of the response of microphone j may be constructed as follows:

Given the known geometry for each microphone we can define c is the speed of sound.

$\underline{x}_j$ is the position of microphone j relative to an arbitrary origin in real space d is a unit vector corresponding to a chosen direction towards the desired source in the same coordinate system as $\underline{x}_j$.

$f_{Hz}$ is the frequency (in Hertz) associated with STFT bin f.—

The far field microphone time delay, $\tau_j$ in seconds relative to the origin is then given by $$\tau_j = -\frac{x_j^T d}{c}$$

This leads to a phase shift for microphone j of $$\theta_{jf} = e^{2\pi \tau_j f_{Hz} i}$$

However the phase response $\theta_{jf}$ is determined, the chosen source s is the source whose corresponding row in $\hat{W}_f^t$ maximises the phase correlation:

$$s = \underset{k}{\mathrm{argmax}} \sum_f \left| \sum_j \frac{\hat{W}_{jkf}^{\dagger}}{|\hat{W}_{jkf}^{\dagger}|} \theta_{jf}^* \right|^2$$

where the sum j runs over the microphones and $\theta_{jf}$ is the (complex) frequency/phase response of microphone j in the selected direction. In principle this approach could be employed to select multiple source directions.

The skilled person will appreciate that a similar approach enables one or more source directions to be determined from $W_i^{\dagger}$, for example for weighting a (required or extraneous) source based on source direction.

Low Latency Implementation

In some examples of the above-described procedure the output of the procedure may be $Y_f$ or $\hat{Y}_f(s)$; additionally or alternatively an output may be the demixing filter $W_f$ or $W'_f(s)$. Where the output comprises a demixing filter this may be provided in the time-frequency domain or converted back into the time domain (as used in eq(1) above) and applied to the time domain data $x_t$. Where filtering is performed in the time domain the time domain data may be delayed so that the filtering is applied to the time domain data from which it was derived, or (as the calculations can be relatively time-consuming), the filtering may be applied to the current time domain data (thus using coefficients which are slightly delayed relative to the data)

In some real-time applications, such as a listening aid, low latency is desirable. In this case, the filtering may be performed in the time domain using eq(1). The filter coefficients w are updated by using the equation for $W'_f(s)$ ("Scaling Ambiguity", above) to design the filter coefficients asynchronously in the STFT domain. For example, if calculation of the filter coefficients can be performed, say, every second then the coefficients are around 1 second out of date. This presents no problem if the acoustic scene is reasonably static (the speakers do not move around much), so that the filter coefficients are appropriate for later samples. If low latency is not needed, the procedure can use an inverse STFT on the equation for $\hat{Y}_f(s)$ ("Scaling Ambiguity", above).

Stereo Filtering

Finally, a stereo output signal can be created by selecting an appropriate pair of rows from $W'_f$ in the equation for $W'_f(s)$ ("Scaling Ambiguity", above). This leads to a more natural sounding output which still retains some of the spatial cues from the source.

A problem of blind audio source separation is how to determine which of the separated source or sources are the ones of interest and which ones are not (for example because they are noise or a source such as a slamming door).

SUMMARY

In general terms, the present disclosure proposes a method of determining which sources are sources of interest in a manner analogous to video cropping.

Consider a video source and multi-microphone audio sources from a captured scene. The video source can be either a live video stream or a video recording of the scene. The audio is separated into its component sources using BSS. The video is displayed, for example on a display such as a screen, and a user indicates a spatial field of view by selecting a region, for example by drawing a shape, on the screen. This may be done by, for example using touch screen functionality on the screen or through some other user interface. The objective is to identify those separated sources that lie in the user specified field of view and to pass them on to the output. This is analogous to video cropping where a portion of the displayed image is selected and the unselected portion is cropped out of the image. Indeed it is envisaged that both types of cropping can be combined into a single action. How the audio outputs are used depends upon the actual application. In one example, the outputs might be mixed and played alongside the cropped video.

Thus, according to a first aspect of the present disclosure, there is provided a method of cropping a portion of an audio signal captured from a plurality of spatially separated audio sources in a scene, the method comprising: capturing the audio signal with one or more recording devices; separating the audio signal into a plurality of components associated with one of the plurality of audio sources; selecting a spatial region in the scene; determining which of the plurality of components are associated with an audio source positioned outside of the selected spatial region; and cropping the plurality of components associated with an audio source positioned outside of the selected spatial region out of the audio signal.

Advantageously, separating out the components of the audio signal according to which source generated the component, for example by using blind source separation on the captured audio signal, allows the component to be cropped out of the audio signal based on the spatial positioning of the source.

In some implementations, performing said blind source separation comprises: converting the captured audio signal to time-frequency domain data comprising a plurality of frames for a plurality of times and frequencies, and constructing a multi-channel filter to operate on said time-frequency data frames to separate the plurality of components by source by calculating a set of filter coefficients corresponding to each source.

In some implementations, said cropping comprises: selecting and applying the set of filter coefficients of the multi-channel filter corresponding to those sources determined to be inside of the selected spatial region.

In some implementations, selecting the spatial region in the scene comprises: on a display of a user device, displaying a spatial representation of the scene; and with a user interface of the user device, selecting the spatial region on the displayed spatial representation. The method may also comprise, with an image capture device, capturing image data of the scene, and constructing the spatial representation of the scene from the captured image data. In some implementations, the method may also comprise cropping out of the image data regions outside of the selected spatial region.

Advantageously, as described above, constructing a spatial representation from captured image data (such as video data) of the scene provides a coordinate system in which the audio cropping (and optionally also image cropping) may be performed.

In some implementations, determining which of the plurality of components are associated with an audio source positioned outside of the selected spatial region comprises: for each of the plurality of components, calculating phase correlations across a set of possible directions of arrival of the component at the one or more recording devices; calculating a probability of observing the calculated phase correlations; and determining the source is outside of the selected spatial region when the calculated probability is below the threshold.

In some implementations, calculating the probability of observing the calculated phase correlations comprises: ranking the phase correlations, comparing the rankings to rankings of phase correlations in training data.

Advantages of this approach, based on combining Bayesian probability with the ranking of the directions from which the components in the audio signal have originated will be described below.

As described in the background section, BSS is known. However, one aspect of the method of the present disclosure is how to associate the separated source streams with the selected field of view or spatial region. The nature of BSS is such that it separates the audio streams on the basis of signal statistics; it generally uses neither location information nor the geometry of the mic array in determining the separation filters. However, most BSS techniques such as Independent Component Analysis (ICA), Independent Vector Analysis (IVA) and Local Gaussian Mixture Models (LGMM) all design a linear demixing filter for each source. These filters do have a spatial response that you can calculate if you know the geometry of the array. Even then, in real world conditions, these spatial responses are very noisy as they are affected by all the room reflections. So one component of the technique that solves this issue is a robust method to estimate the likelihood that the demixing separation filter corresponds to the selected field of view. It is noted that the input envisaged being used with the present disclosure can be a recording of a multi-microphone signal. It is also noted that this type of cropping based upon a spatial field of view should not be confused with cropping in time, which is a common feature in audio editors.

As will be appreciated by the skilled person, most multi-microphone methods of BSS work in the time-frequency domain. Examples include Fast Independent Component Analysis (FastICA), Maximum Likelihood Independent Component Analysis(ML-ICA), Independent Vector Analysis (IVA) and Local Gaussian Mixture Models (LGMM). Each of these techniques designs a demixing filter in the time-frequency domain for each source based upon the observed statistics of the audio.

The present disclosure focusses on ML-ICA though it should be understood that the methods described herein can be applied to other sorts of BSS and not just those mentioned above. The techniques described below are thus provided by example only and are not intended to be limiting.

In ML-ICA we use the Short Time Fourier Transform to transform the audio data into the time-frequency domain. In this domain the demixing filter is a simple matrix multiplication as multiplication in the frequency domain is equivalent to convolution in the time domain.

Let
n be the microphone index
f be the frequency index
t be the STFT frame index
m be the source index
$X_{ntf}$ be a Complex Element of the STFT of the Multi-Microphone Audio Data
$Y_{mtf}$ be a complex element of the STFT of the source estimates
$W_f$ be the complex demixing matrix for frequency f with the frequency permutations resolved So we are estimating the sources using $$Y_{mft} = \sum_n W_{nmf}^* X_{ntf}$$

For ML-ICA we use a complex Laplacian likelihood distribution for the sources. The Laplacian distribution is in some sense the most heavy tailed log concave distribution, and it is this heavy tailed nature of speech and most audio sources that we are leveraging to perform the BSS. We can express the total log-likelihood of the observed microphone data as $$\ln p(X \mid W) = \sum_f \sum_t \left( \ln \det W_f^H W_f - \sum_m |Y_{mft}| \right)$$

We then use an optimisation method such as steepest ascent or natural gradients to find the demixing matrix which maximises the log likelihood.

The above equations only estimate the sources up to a permutation and scaling ambiguity. We resolve the scaling ambiguity by projecting the source estimates back to the original microphone as follows. Let $H_f = W_f^{H\dagger}$, the Penrose pseudo inverse of $W_f^H$.

The source estimate $S_{nmft}$ for source m at microphone n is found by $$S_{nmft} = H_{nmf} Y_{mft} = H_{nmf} \sum_n W_{nmf}^* X_{ntf}$$

We then have to resolve the permutation alignment problem. Every frequency index can have a different random permutations. We note that the temporal activity of adjacent STFT frequencies is often correlated for a given source. Ideally we would find the permutation for each frequency that maximises some correlation metric of the temporal activity. Unfortunately it is impractical to find the true maximum, so we use a greedy algorithm that iterates across frequency finding the permutation for the next frequency that correlates best with the ones we have already matched. This will give us a local maximum of our correlation metric and is normally good enough to resolve the permutation alignment problem.

Once the relative permutations are resolved, the time domain source estimates can be calculated by taking the inverse STFT or equivalently converting the frequency domain filters to a time domain representation and applying in the time domain.

There is nothing in the BSS process that indicates which source estimates correspond to which real world source and it is here where the audio crop concept of the present disclosure is used. We identify which sources are likely to have come from the user selected region and select those ones for the output.

Correctly identifying the source angle from the output source is a very difficult problem.

One known method is the Steered Response Power Phase Transformation (SRP-PHAT), which is generally known to be robust in the presence of noise. In the SRP-PHAT we work out the relative time delays between the microphones for a signal arriving from a direction d. Let's express the direction as a unit vector d in 3-space and the positions of the microphones as $x_n$ in the same coordinate system. Accordingly, in some implementations, the set of possible directions of arrival comprises a set of vectors in a 3D coordinate system of the spatial representation of the scene. We also know the speed of sound c. We can therefore work out the time delay for a far field signal relative to an arbitrary origin $\hat{x}$ as $$\tau(x_m, d) = -\frac{d^T(x_n - \hat{x})}{c}$$

The complex phasor at frequency index f and STFT length F is then $$\phi_f(x_n, d) = \exp\left(\frac{2\pi f \tau(x_n, d) i}{F}\right)$$

We also define the sign of a complex number as $$\operatorname{sign} z = \begin{cases} 0 : z = 0 \\ \dfrac{z}{|z|} : z \neq 0 \end{cases}.$$

The SRP-PHAT is then defined as $$\Phi_f(X_f, d) = \sum_t \left| \sum_n \operatorname{sign}(X_{nft})^* \phi_f(x_n, d) \right|^2$$

$$\Phi(X, d) = \sum_f \Phi_f(X_f, d)$$

Note that there are many variants of SRP-PHAT including weighted versions etc. To localise a source we then search over a grid of points for d and choose the direction with the highest phase correlation $\Phi(X,d)$.

However, when we apply SRP-PHAT to the source outputs we discover that the inter mic phasors depend solely on the mixing matrix estimates $H_f$. If we work through the equations we see that $$\Phi_f(S_{mf}, d) = \sum_t \left| \sum_n \text{sign}(s_{nmft})^* \phi_f(x_n, d) \right|^2 = \sum_t \left| \text{sign}(Y_{mtf})^* \sum_n \text{sign}(H_{mnf})^* \phi_f(x_n, d) \right|^2 = T \left| \sum_n \text{sign}(H_{mnf})^* \phi_f(x_n, d) \right|^2$$

Other BSS methods have similar properties. For example LGMM learns a spatial covariance matrix for each source at each frequency $R_{mf}$. You can show that $$\Phi_f(S_{mf}, d) \approx T \sum_n \sum_{n'} \phi_f(x_n, d)^* \text{sign}(R_{nn'mf}) \phi_f(x_{n'}, d)$$

This becomes exact if $R_{mf}$ is a rank 1 matrix and we get $R_{nn'mf} = H_{nmf} H^*_{n'mf}$.

The problem with these PHAT based methods in BSS is that they tend to become very unreliable when applied to the BSS outputs. If we look at the problem from a Bayesian point of view we find that the phase correlation function $\Phi_f(S_{mf}, d)$ is really not well behaved at all. It can often have large secondary peaks due to spatial aliasing and is generally very noisy. The audio cropping method of the present disclosure accordingly solves this problem by advantageously combining Bayesian theory with rank statistics to give a much more robust approach. This combined approach is referred to herein as Bayesian Rank Statistics.

Let's define the set of directions in the user selected field of view region as $\mathbb{D}$ and the set of directions not in the region as $\overline{\mathbb{D}}$. We can define the source selection problem as finding the probability that source m comes from the selected region.

$$p(d \in D | S_m)$$

We still use the phase correlation $\Phi_f(S_{mf}, d)$ but now also use the technique we call Bayesian Rank Statistics which is described below For each frequency we calculate the phase correlation over the entire set of directions $d \in \mathbb{U}$. We then define the rank of the direction as $r_f(S_{mf}, d)$ as the index of the observation in the sorted list of phase correlations. Accordingly, in some implementations, the first parameter by which the plurality of components of the audio signal are ranked is the phase correlation of the possible set of directions of arrival at the recording device. Rank statistics have lots of useful properties:

- The rank of an observation is independent of any monotonic transformation of the data. This property means that the rank is reasonably invariant to the egregious behaviour of the phase correlation.
- The probability of a given rank for any independent identically distributed (i.i.d.) observations is 1/N!, where N is the number of directions
- The probability of a given rank for any independent but non identically distributed observations is a tractable problem.

These properties mean that we convert the difficult to analyse distributions of the phase correlation $\Phi_f(S_{mf}, d)$ into something that is tractable. In doing so we have thrown away some information, but we have created a tractable framework that more than compensates for this loss of information.

First, although we assume that the observations are independent, the ranks are not. This however is easy to analyse. Let's abbreviate the notation for frequency f and define $$r_k = r_f(S_{mf}, d_k), d_k \in \mathbb{U}$$

From Bayes rule we have the joint probability of all the ranks is $$p(r_1 \cdots r_N) =$$
$$p(r_1)p(r_2 \cdots r_N | r_1) = p(r_1)p(r_2 | r_1)p(r_3 \cdots r_N | r_1, r_2) = \prod_k p(r_k | r_1 \cdots r_{k-1})$$

Note that, as described above, the index notation $1 \ldots N$ in $(r_1 \ldots r_N)$ indicates which of the directions d is being referred and does not mean rank 1, rank 2, rank 3, etc. That is, $r_1$ refers to whatever rank the phase correlation associated with $d_1$ has, $r_2$ refers to whatever rank the phase correlation of $d_2$ has, $r_3$ refers to whatever rank the phase correlation associated with $d_3$ has and so on.

As we have assumed that the observations are independent, knowing $\Phi_f(S_{mf}, d_k)$ doesn't effect the probability that $\Phi_f(S_{mf}, d_{m \neq k}) < \Phi_f(S_{mf}, d_k)$ so the ordering of the ranks $r_k \ldots r_N$ is independent of the knowing $\Phi_f(S_{mf}, d_1) \ldots \Phi_f(S_{mf}, d_{k-1})$. If we can define $p_k(r')$ as the probability of the ranks in the sub problem of sorting the elements $\Phi(S_{mf}, d_k) \ldots \Phi_f(S_{mf}, d_N)$ we can define the following algorithm for calculating $p(r_1 \ldots r_N)$.

Sort the phase correlations $\Phi_f(S_{mf}, d_k)$ over the directions and store the ranks in a temporary list r'
Initialise q=1
For k=2 to N
  $q \leftarrow q \cdot p_k(r_1')$
  For i=N−k down to 1

$$r'_i \leftarrow \begin{cases} r'_{i+1} : r'_{i+1} < r_1' \\ r'_{i+1} - 1 : r'_{i+1} > r_1' \end{cases}$$

$p(r_1 \ldots r_N) = q$

One consequence of this formula is that if $\Phi_f(S_{mf}, d_k) \ldots \Phi_f(S_{mf}, d_N)$ are i.i.d. we get that $p_k(r_i') = 1/N-k+1$ and that $$p(r_k \cdots r_N | r_1 \cdots r_{k-1}) = \frac{1}{(N-k+1)!}.$$

It should be noted that the ordering of the algorithm from lowest to highest in the Bayes derivation is arbitrary and the terms can be factored out in any order. So if our model has a subset of the phase correlations being i.i.d we can rearrange the algorithm. In particular we might say that only the maximum and/or minimum ranks are not i.i.d. and we can then rearrange the above formulae for a much more compact and efficient algorithm.

So with Bayesian rank statistics all we need is to know $p_k(r'_{fi}|s)$ which is simply a triangular matrix which we can simply estimate from some training data. To use training data we apply BSS to recordings where the sources are at known positions. We do this in a manner that covers all of the directions in U with a wide variety of different types of material. To reduce the recording burden it is sensible to record the sources individually and then use artificial mixing to maximise the amount of test scenarios created from the recordings. We then apply BSS to all these different test scenarios. As we know the ground truth we can use an oracle matching algorithm to establish which BSS output corresponds to which true source. Equipped with this we note that $p_k(r'_{fi}|s)$ is the likelihood of the rank over a subset of the directions given the state. We can estimate this by looking at the proportion of times that rank is achieved in the parts of our training corpus that match the state. As written this needs a large number of tests to measure with any accuracy. However, if we use some of the simplification assumptions such as only using the maximum/minimum and that all directions behave similarly, we can significantly reduce the amount of training required at the expense of losing some discrimination in the overall algorithm.

The above exposition shows how to calculate the probability of the ranking. Now we can introduce a full Bayesian inference model to solve the audio cropping problem. Let's introduce an arbitrary state variable s. We can change the algorithm above to be conditional on the state so we can evaluate $p(r_1 \ldots r_N|s)$ in terms of the sub problems $P_k(r'_i|s)$.

In the audio crop case the states we are going to use are
1 state for each direction $s_d$ representing that source estimate m is genuinely at direction d
Optionally one state $s_{noise}$ for source estimate m representing diffuse noise with no associated direction.
We denote the set of possible states as $\mathbb{S}$.

For each state we can evaluate $p(r_1 \ldots r_N|s)$. There are some simple assumptions we can make that reduce the memory usage required and speed up the computation. The main assumption is that the directions not corresponding to the state are all i.i.d. This leads to the $$p(r_1 \cdots r_N | s_{noise}) = \frac{1}{N!}$$

$$p(r_1 \cdots r_N | s_d) = p(r_d | r_1 \cdots r_{d-1}, r_{d+1} \cdots r_N, s_d) p(r_1 \cdots r_{d-1}, r_{d+1} \cdots r_N | s_d) = $$

$$p(r_d | r_1 \cdots r_{d-1}, r_{d+1} \cdots r_N, s_d) \frac{1}{(N-1)!}$$

The next assumption we can make is that all directions have the same distribution of ranks for their $p(r_d|r_1 \ldots r_{d+1} \ldots r_N, s_d)$. This means we need only store a single vector of length N for each frequency and the algorithm for calculating $p(r_1 r \ldots r_N|s_d)$ can be calculated using a simple length N lookup table. For reasons that will become apparent we actually store the log probabilities in the lookup table.

Now we reintroduce the frequency and source indexing. Let's rewrite $p(r_1 \ldots r_N|s)$ as $p_m(r_{1f} \ldots r_{Nf}|s)$. Assuming independence between frequencies we get that $$p_m(r_{11} \cdots r_{NF} | s) = \sum_f \ln p_m(r_{1f} \cdots r_{Nf} | s)$$

Or equivalently $$\ln p_m(r_{11} \cdots r_{NF} | s) = \sum_f \ln p_m(r_{1f} \cdots r_{Nf} | s)$$

We can introduce some priors on the states as p(s) and then use Bayes rule as $$p_m(s | r_{11} \cdots r_{NF}) = \frac{p_m(r_{11} \cdots r_{NF} | s) p(s)}{\sum_{s \in \mathbb{S}} p_m(r_{11} \cdots r_{NF} | s) p(s)}$$

As we have assumed all directions are equivalent, the priors for each $s_d$ should be uniform. The prior $p(s_{noise})$ should reflect the a-priori expected likelihood of the source estimate being ambient noise.

We now estimate the probability that source m comes from our audio crop region as $$p_m(d_m \in D | r_{11} \cdots r_{NF}) = \sum_{d \in D} p_m(s_d | r_{11} \cdots r_{NF})$$

We can repeat the exercise for each of the other sources. This gives us a probability of each source estimate coming from our audio crop region.

In other words, rather than attempting to estimate source position or direction based on the distributions of observed phase correlations $\Phi_f(S_{mf}, d)$ which are difficult to analyse, we instead turn the observed phase correlations $\Phi_f(S_{mf}, d)$ into distributions of ranks which are easier to analyse and which allow us to more accurately and efficiently estimate source position or direction.

It should be noted that the above algorithm is just one of many ways you can use the statistics of ranks in a Bayesian framework to estimate the likelihood of a source coming from the audio crop region. For example, one possibility is to use a Hidden Markov Model to introduce some probabilistic model for the evolution of the state s over time.

Once we have a probability measure for the likelihood we can decide whether a source is in the audio crop region by applying a simple threshold to the likelihood.

Once we have chosen which sources belong to the selected region we can further refine our selection. The simplest approach is to simply sum the source estimates for the final output. Alternatively a voice activity detector can be used to only let through the sources that look like they contain speech. Accordingly, in some implementations, the method comprises recognising in the cropped audio signal a speech component, isolating the speech component, and outputting with a playback device the speech component.

Another method is to only let through the dominant source in the region, which is appropriate in the context of a video call where generally only one person at a time will speak in a conversation. Accordingly, in some implementations, the method comprises identifying in the cropped audio signal the component of the plurality of components having the highest volume, and outputting with a playback device the component having the highest volume.

The present disclosure accordingly finds uses in, for example, allowing a user to control which audio sources are muted according to position in a room.

According to a second aspect of the present disclosure, there is provided an audio-visual system comprising: one or more recording devices configured to capture an audio signal from a plurality of spatially separated audio sources in a scene, a user device comprising a display configured to display a spatial representation of the scene and a user interface for selecting a spatial region on the displayed spatial representation, and one or more processors configured to: separate the audio signal into a plurality of components associated with one of the plurality of audio sources; determine which of the plurality of components are associated with an audio source positioned outside of the spatial region selected with the user interface; and cropping the plurality of components associated with an audio source positioned outside of the selected spatial region out of the audio signal.

In some implementations, the user device comprises said one or more recording devices.

In some implementations, the audio-visual system comprises one or more image capture devices configured to capture image data of the scene, and the one or more processors are configured to construct the spatial representation of the scene from the captured image data.

In some implementations, the user device also comprises said one or more image capture devices.

In some implementations, the one or more processors are configured to crop out of the captured image data of the scene regions outside of the selected spatial region.

In some implementations, the audio-visual system comprises one or more playback devices configured to output the cropped audio signal and the cropped image data.

In some implementations, the user device is a mobile device such as a smartphone, tablet, or other portable, smart device able to capture audio and image data.

In some implementations, the audio-visual system comprises a video teleconferencing system.

Advantageously, the above described audio-visual system provides the same advantages as described above in connection with the method according to the present disclosure.

BRIEF DESCRIPTION OF THE DRAWINGS

These and other aspects of the invention will now be further described by way of example only, with reference to the accompanying figures in which.

DETAILED DESCRIPTION

Figure 1:
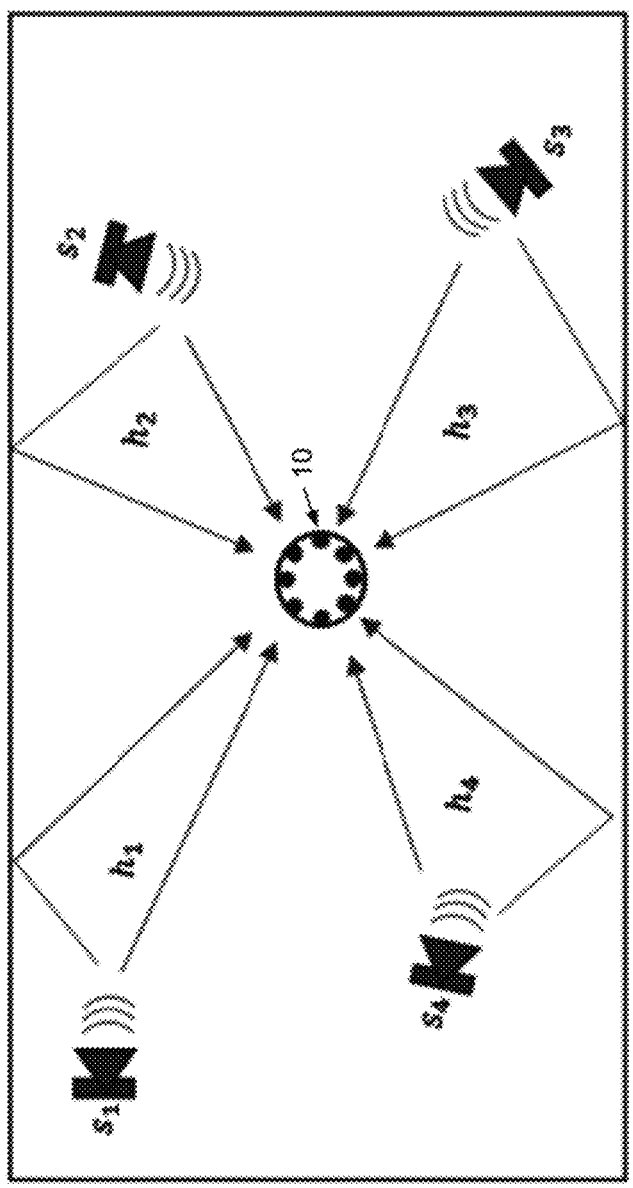
FIG. 1 is an illustration of an example acoustic scene.
Figure 2:
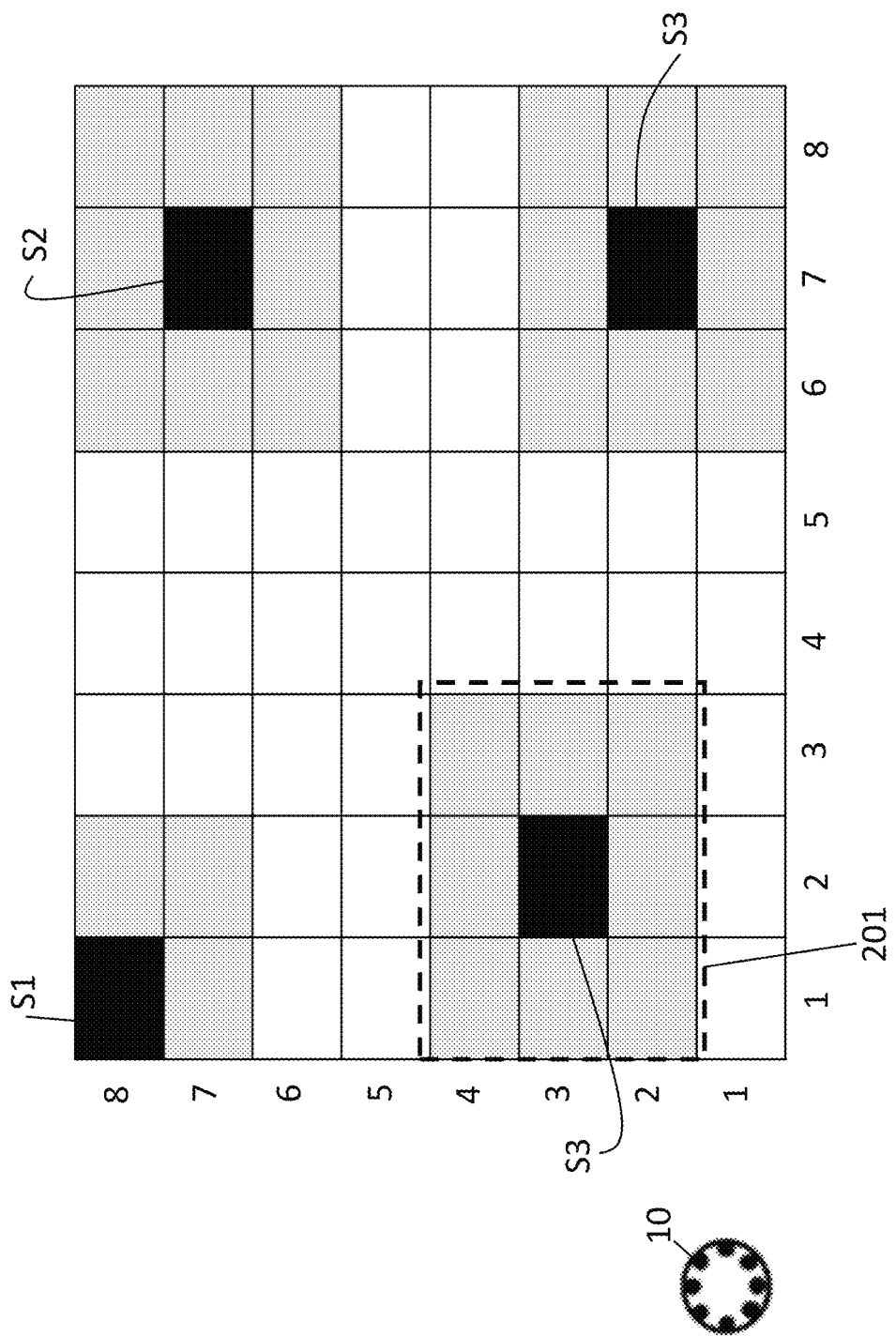
FIG. 2 is a spatial representation of the acoustic scene of FIG. 1.

As described above, FIG. 1 is an illustration of an example acoustic scene comprising four sources S1-S4 with respective audio channels H1-H4 to a recording device such as a microphone array 10 comprising (in this example) 8 microphones P FIG. 2 is a spatial representation of the acoustic scene of FIG. 1 onto which a simplified heat map of phase correlation values $\Phi_f(S_{mf}d)$ has been overlaid. The spatial representation in this example comprises 2D coordinates system made up of a 8×8 grid of squares indicated by coordinates (1, 1) to (8, 8) making up a grid 64 unique directions $d_{1\ldots 64}$. In practice, it is envisaged that a spatial representation may comprise a 3D or other coordinate system. Each square is associated with a direction $d_{1\ldots 64}$ relative to the recording device 10 position.

In this simplified example, the sources S1, S2, S3 and S4 are respectively at coordinates (1, 8), (7, 7), (7, 2) and (2, 3) which, if the 64 unique directions in the scene start at number 1 for coordinate (1,1) and 64 for coordinate (8, 8) correspond to directions $d_{15}$, $d_{18}$, $d_{57}$, $d_{56}$.

The recording device 10 captures an audio signal which is separated into its constituent components using blind source separation as described above.

The phase correlation values $\Phi_f(S_{mf}d)$ for each of the directions $d_{1\ldots 64}$ in the grid are calculated (that is, the phase correlation values for directions at coordinates (1, 1) all the way through to (8, 8) are calculated) and, in this simplified example, have the distribution shown in the heat map of FIG. 2. The grid squares that contain the sources contain a phase correlation peak, whereas grid squares far from the sources have low phase correlation values. For the sake of example only, let's say the peak has a phase correlation value of 1, the surrounding directions have a value of 0.5 and the other directions have a value of 0. It is of course noted that, in practice, the distribution of phase correlations $\Phi_f(S_{mf}d)$ are unlikely to be as simple as is shown in FIG. 2 and are instead difficult to analyse for the reasons given above.

Assume a user has selected a spatial region indicated by box 201 shown in FIG. 2. In this example, the selected region contains only source S3 so the components associated with sources S1, S2, and S3 are to be cropped out.

To determine which of the plurality of components are associated with a source positioned outside of the selected spatial region and which are associated with a source positioned inside the selected spatial region, phase correlation values $\Phi_f(S_{mf}d)$ are ranked in a list, for example by high to low or low to high phase correlation value or some other order. Thus the directions or coordinates corresponding to a peak will be ranked $1^{st}$, the immediately surrounding directions or coordinates will be ranked $2^{nd}$ to $9^{th}$ and the other directions or coordinates will be ranked $10^{th}$ to $64^{th}$ To help illustrate this, let's consider the example of the $2^{nd}$ row of directions, that is, the row of squares indicated by coordinates (1, 2) to (8, 2) corresponding to directions $d_{9\ldots 16}$ using the above index notation. A simplified distribution of ranks may be as follows:

Coordinate (7,2) or direction $d_{215}$ has a peak phase correlation value of 1 so is ranked $1^{st}$. Coordinates (1,2), (2,2), (3,2), (6,2), (8,2) or directions $d_{9, 10, 11, 14, 16}$ have phase correlation values of 0.5 so will be ranked among the directions in the scene having the ranks $2^{nd}$ to $9^{th}$. Note that the rank is the index into any valid sorting of the phase correlations such that each phase correlation is less than or equal to the next. This means identical phase correlation values will be assigned consecutive ranks. In practice however noise effects make identical phase correlations highly unlikely. Coordinates (4, 2), (5, 2) or directions $d_{12, 13}$ have phase correlation values of 0 so are ranked among the directions in the scene having the ranks $10^{th}$ to $64^{th}$.

Thus, using the index 1 ... N notation to indicate directions $d_1 ... _{64}$ we might have by way of illustrative example a rank distribution for directions ($r_9 ... r_{16}$) of:

$r_9$: $2^{nd}$
$r_{10}$: $3^{rd}$
$r_{11}$: $4^{th}$
$r_{12}$: $21^{St}$
$r_{13}$: $57^{th}$
$r_{14}$: $9^{th}$
$r_{15}$: $1^{st}$
$r_{16}$: $7^{th}$

We can follow the same process for all the directions $d_1 ... _{64}$ in the scene to obtain the rank distribution ($r_1 ... r_{64}$). If we do the same for all observed frequencies f we obtain the rank distribution ($r_{11} ... r_{64F}$) which is the rank distribution across all frequencies and across all directions.

We can now compare our current, observed rank distribution with rank distributions from previously captured training data where the source positions or directions were known. This allows us to estimate the probability of observing the rank distribution($r_{11} ... r_{64F}$) we actually observed, for/given the many possible source positions or directions (described above as states s) in the training data. That is, by comparing the observed rank distribution to training data rank distributions, we can estimate the probabilities:

$p_m(r_{11} ... r_{64F}|S)$

As previously described, by using Bayes rule on the now known probabilities $p_m(r_{11} ... r_{64F}|s)$ we obtain $p_m(s_d| r_{11} ... r_{64F})$ which allows us to evaluate the expression for the probability that a source m comes from our selected audio crop region 201:

$$p_m(d_m \in D | r_{11} \cdots r_{64F}) = \sum_{d \in D} p_m(s_d | r_{11} \cdots r_{64F})$$

We then do the same for all the sources m. We can then apply a threshold to the calculated probabilities $p_m(d_m \in Dr_{11} ... r_{64F})$ to make the determination as to whether or not a source m in direction d is or isn't in the set of directions $D$ inside the selected spatial region.

When we know which sources are or aren't inside the selected spatial region, we can simply remove the component or components of the audio signal associated with those sources from the audio signal and it is this removal (based position in the scene) which is referred herein to as cropping. The audio signal can then be passed to a playback device or be processed further.

Figure 3A:
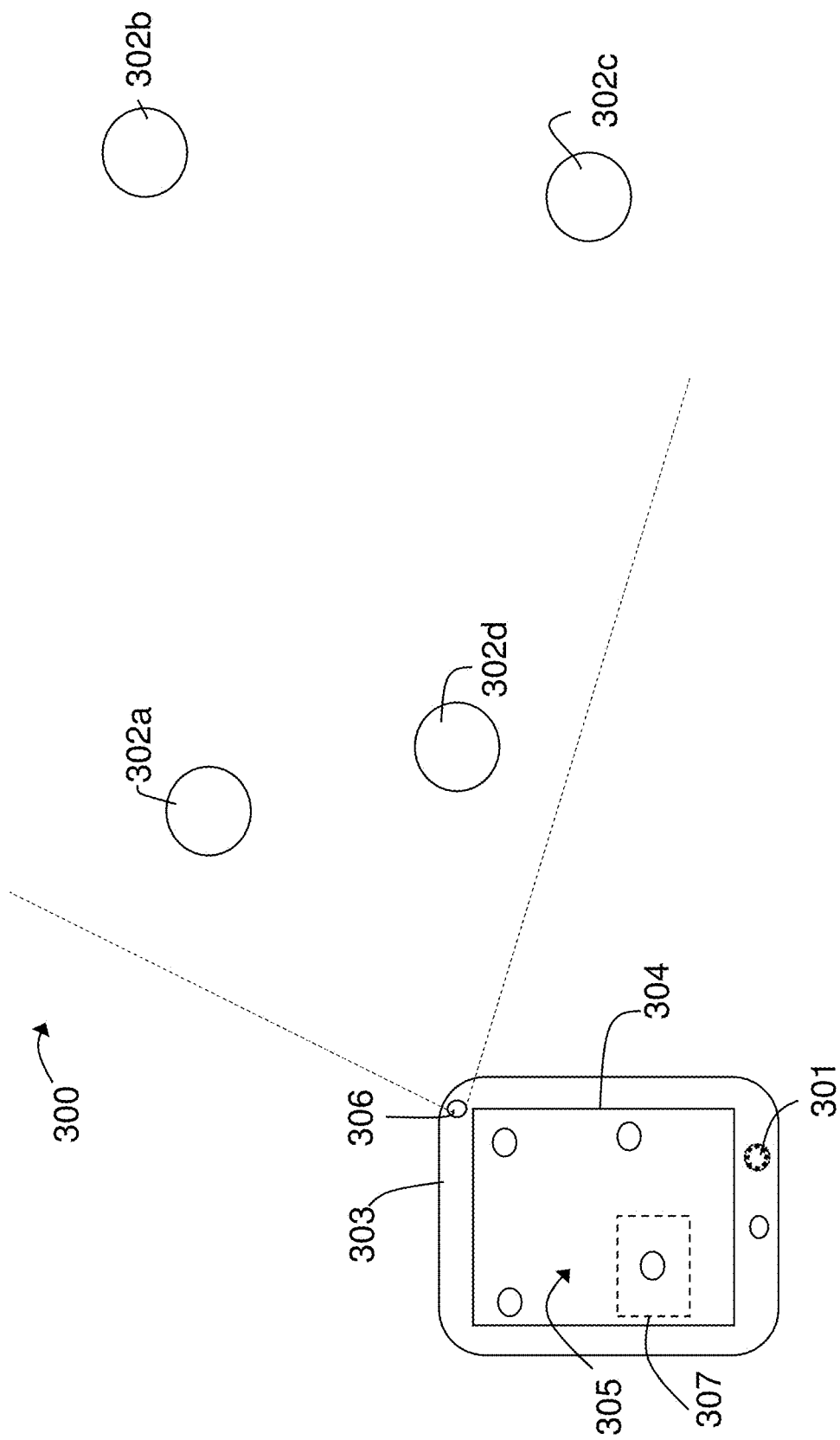
FIG. 3a is an audio-visual system according to the present disclosure.

FIG. 3a is an illustration of an audio-visual system 300 according to the present disclosure. The audio-visual system 300 comprises one or more recording devices 301, for example a microphone array such as that which may be found in a user device 303 such as a smartphone or tablet or other mobile device, configured to capture an audio signal from a plurality of spatially separated audio sources 302a-302d in a scene. It is also envisaged that the one or more recording devices 301 may be separate to the user device 303 and instead communicatively coupled it. The audio-visual system 300 accordingly comprises said user device 303 comprising a display 304 configured to display a spatial representation 305 of the scene. The special representation may, for example, be a graphical rendering of the scene constructed from a video or image of the scene captured by an image capture device 306. As with the one or more recording devices 301, the one or more image capture devices 306 may either be part of the user device 303 or separate thereto, for example in the case of a smartphone, the on board camera may be used or an accessory camera may instead be connected to it. In the case of a videoconferencing system, the image capture device 306 may be a webcam or other accessory such device. The audio-visual system 300 may accordingly comprise one or more processors configured to construct the spatial representation of the scene from the captured image data.

The user device 303 is provided with a user interface for selecting a spatial region on the displayed spatial representation 305. The user interface may be a touchscreen interface allowing the user to drag a shape around a desired spatial region. Alternatively, any other known input interface and/or software may be used to allow a user to select a spatial region on the spatial representation and to associate the selection with the corresponding spatial region in the scene. To indicate the selection, a visual representation of the selection 307, for example an outline around the selected region, may be rendered on the display.

Figure 3B:
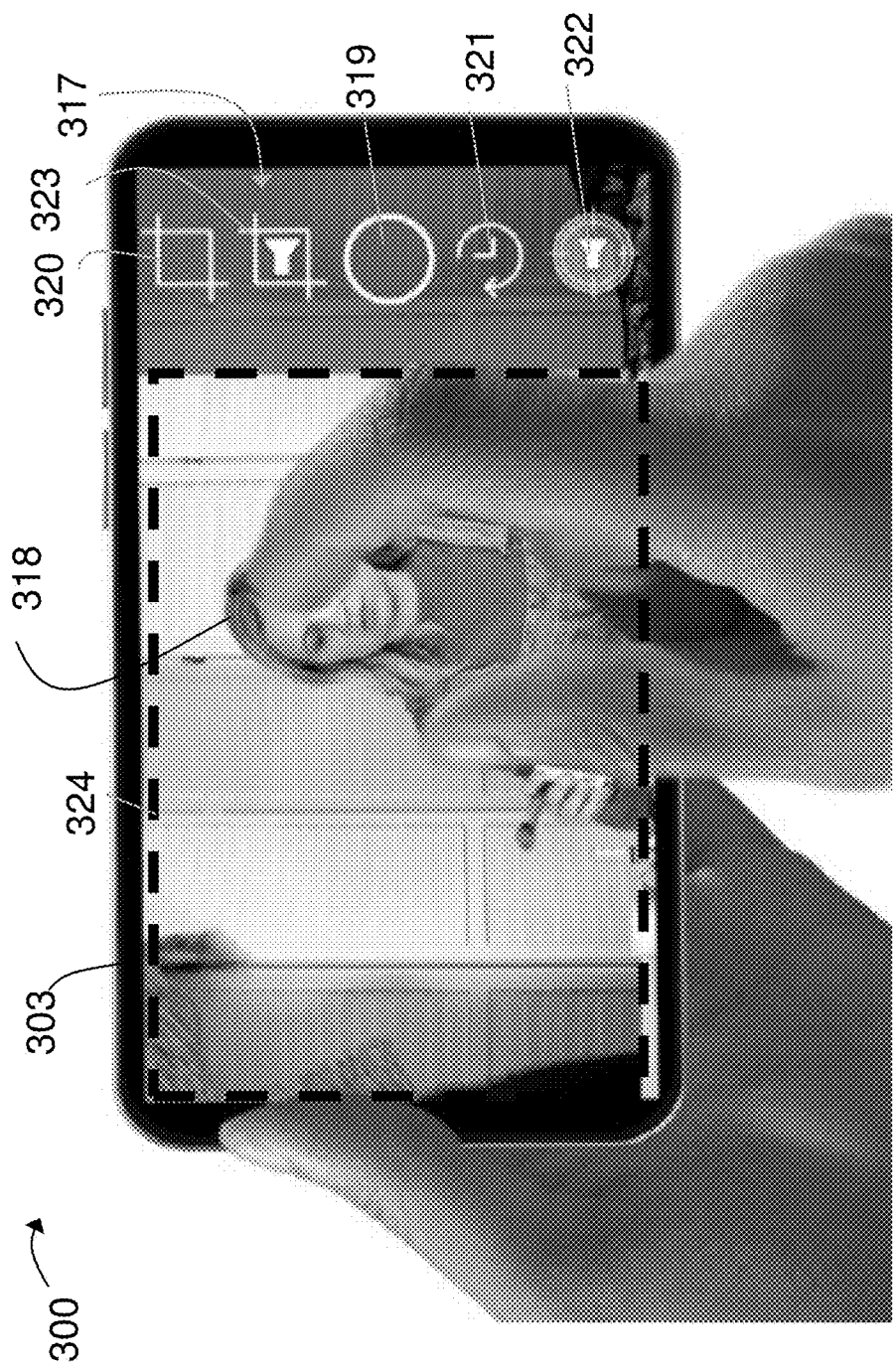
FIG. 3b illustratively shows an example user interface of an audio-visual system according to the present disclosure.

FIG. 3b illustratively shows an example user interface 317 of an audio-visual system 300 according to the present disclosure. The user device 303 in this example is a smartphone recording a video of a user 318. The visual representation of the captured video data is displayed on the display of the user device 303. The user interface 317 is provided with a number of known recording and editing options, for example, record video 319, crop image/video 320, timer options 321 and sound options 322. However, in addition to the known editing options and in accordance with the present disclosure, a new crop audio button 323 is provided which prompts the user to drag a selection over the spatial region 3 they would like to keep the audio from. Once the selection 324 has been made, any audio signal components associated with audio sources arriving at the one or more recording devices from directions outside of the selected spatial region may be cropped out of the audio signal in the manner as described above.

It is further envisaged that the user may simultaneously apply the crop image/video 320 and crop audio 323 functionalities at the same time. The user may also be prompted when cropping image/video if they would also like to crop audio to match their image/video cropping selection.

In the example of FIG. 3b, the user selection is made using a touchscreen and well known pinch or pull zoom gestures commonly used for by image/video cropping methods to allow a user to make a selection for example of a rectangular area on the display, although other shapes and gesture or selection methods are also envisaged. For example, it is envisaged the user may simply tap a region on the display which will select a spatial region of a predetermined size. For example, the user might tap on the mouth or face of a person in the scene and that would select a correspondingly sized region around that person's mouth.

As described in connection with the method above, the one or more processors of the audio-visual system 300 are accordingly configured to: separate the captured audio signal into a plurality of components associated with one of the plurality of audio sources 301a-301d; determine which of the plurality of components are associated with an audio source positioned outside of the spatial region selected with the user interface; and crop the plurality of components associated with an audio source positioned outside of the selected spatial region out of the audio signal.

The one or more processors may further be configured to crop out of the captured image data any regions outside of the user's selection. Thus the user may, in one step, crop both the image data and the audio data thereby providing significant advantages over known methods.

Finally, the audio-visual system 300 comprises one or more playback devices such as a display and/or speakers (not shown) configured to output the cropped audio signal and/or the cropped image/video data.

Figure 3C:
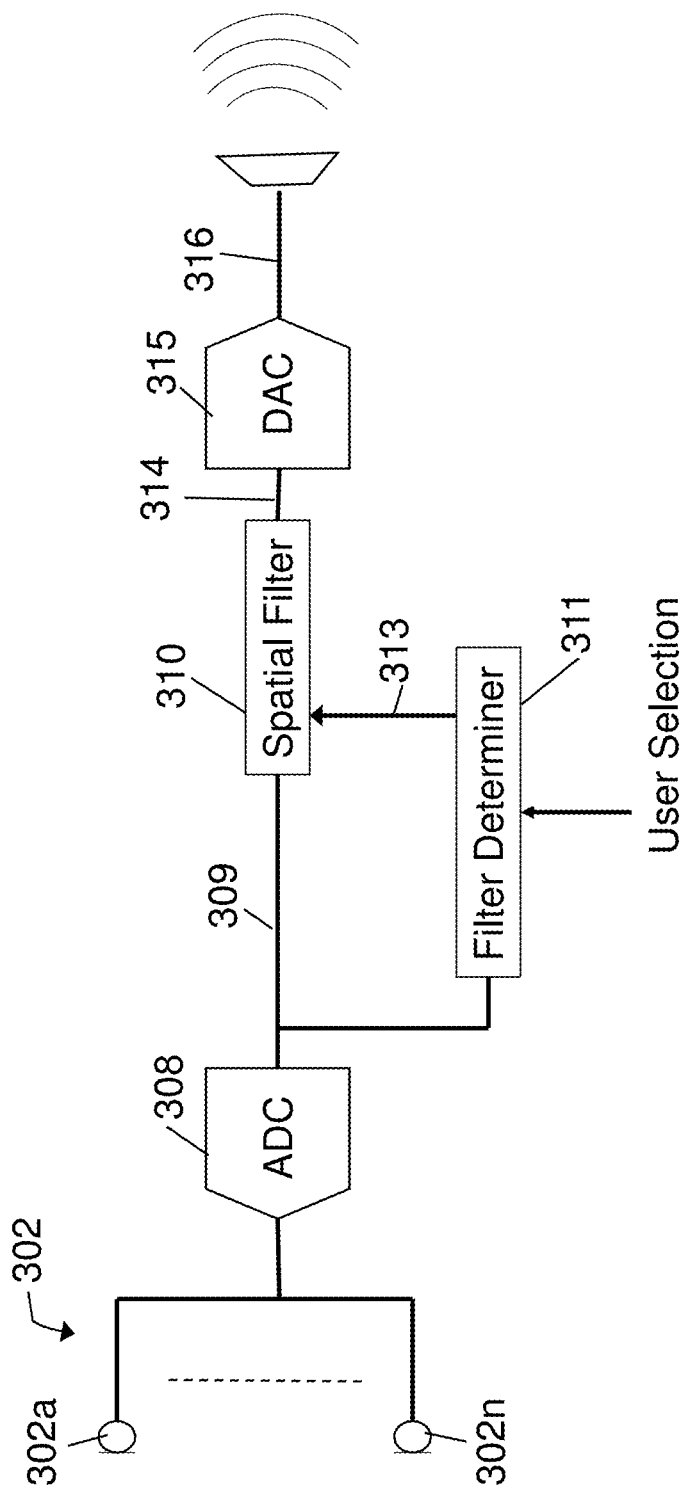
FIG. 3c illustratively shows example architecture of an audio-visual system according to the present disclosure.

FIG. 3c illustrates example architecture of the audio-visual system 300 of the present disclosure. As described above, the audio-visual system 300 comprises one or more recording devices 302, for example a microphone array with microphones 302a-n, coupled to a multi-channel analogue-to-digital converter 308. This provides a digitised multi-channel audio output 309 to a spatial filter 310 which may be implemented as a multi-channel linear convolutional filter, and to a filter coefficient determiner 311. The filter coefficient determiner 311 determines coefficients of a demixing filter which are applied by spatial filter 310 to extract audio from one (or more) sources for a demixed audio output 314. The filter determiner 311 accepts user input, for example the above described user specified spatial region, and has an output 313 comprising demixing filter coefficients for the selected spatial region. The demixed audio 314 is provided to a digital-to-analogue converter 315 which provides a time domain audio output 316, for example to speakers or headphones or the like, or for storage/further processing (for example speech recognition), communication (for example over a wired or wireless network such as a mobile phone network and/or the Internet), or other uses.

It is assumed that the acoustic scene is quasi-static and thus the filter coefficient determiner 311 and spatial filter 310 can operate in parallel. The latency is then determined by the main acoustic path, and depends upon the group delay of the filter coefficients, the latency of the spatial filter implementation, and the input/output transmission delays. Many different types of spatial filter may be used for example one low latency filter implementation is to use a direct convolution; a more computationally efficient alternative is described in Gardener, W G (1995), "Efficient Convolution without Input-output Delay", Journal of the Audio Engineering Society', 43 (3), 127-136.

The skilled person will recognise that the signal processing illustrated in the architecture of FIG. 3c may be implemented in many different ways. For example the filter determiner, in some implementations with the above described user interface, and/or spatial filter and/or DAC 315 may be implemented on a general purpose computing device such as a mobile phone, tablet, laptop or personal computer. In embodiments the microphone array and ADC 308 may comprise part of such a general purpose computing device. Alternatively some or all of the architecture of FIG. 3c may be implemented on a dedicated device such as dedicated hardware (for example an ASIC), and/or using a digital signal processor (DSP). A dedicated approach may reduce the latency on the main acoustic path which is otherwise associated with input/output to/from a general purpose computing device, but this may be traded against the convenience of use of a general purpose device.

Figure 4:
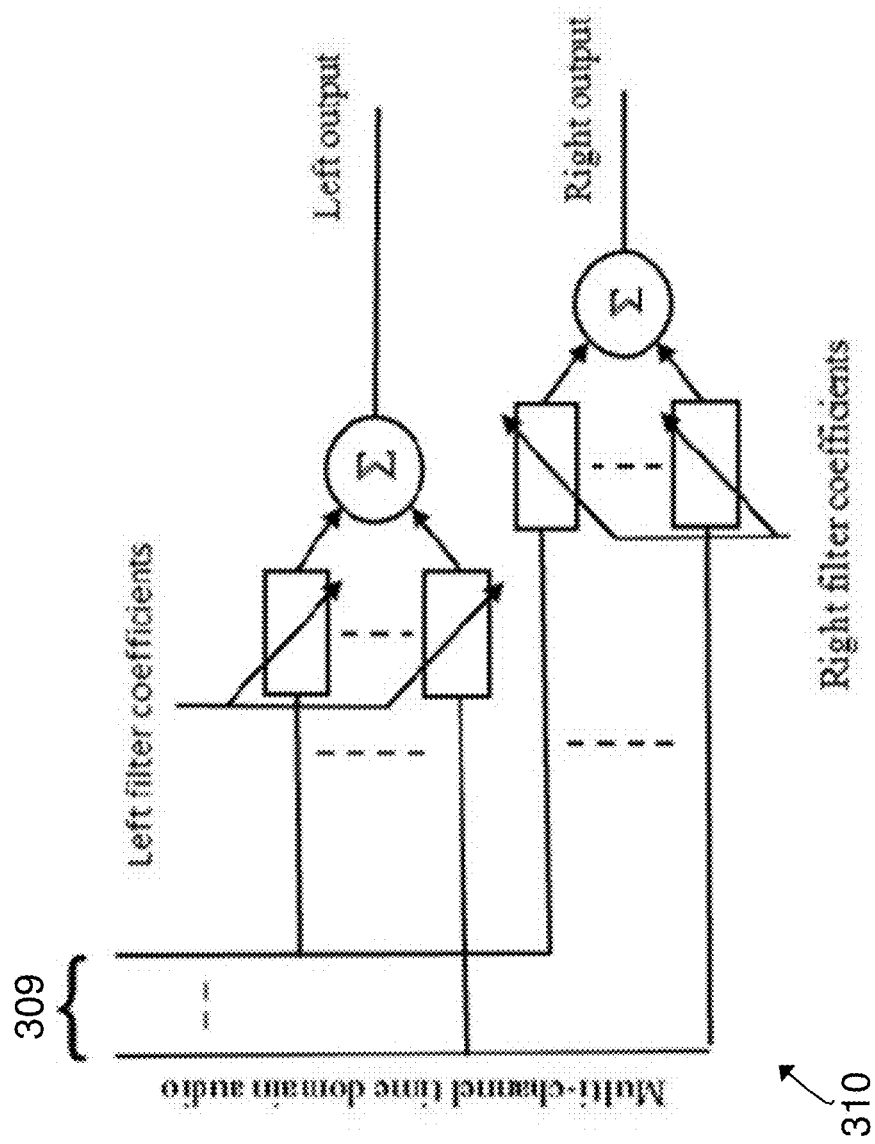
FIG. 4 illustratively shows example architecture of a spatial filter according to the present disclosure.

An example spatial filter 310 for the architecture of FIG. 3c is shown in FIG. 4. The illustrated example shows a multi-channel linear discrete convolution filter in which the output is the sum of the audio input channels convolved with their respective filter co-efficients, as described in eq(1) in the background section above. In embodiments a multi-channel output such as a stereo output is provided. For a stereo output either the spatial filter output may be copied to all the output channels or more preferably, as shown in FIG. 3a, a separate spatial filter is provided for each output channel. This latter approach is advantageous as it can approximate the source as heard by each ear (since the microphones are spaced apart from one another). This can lead to a more natural sounding output which still retains some spatial cues from the source.

Figure 5A:
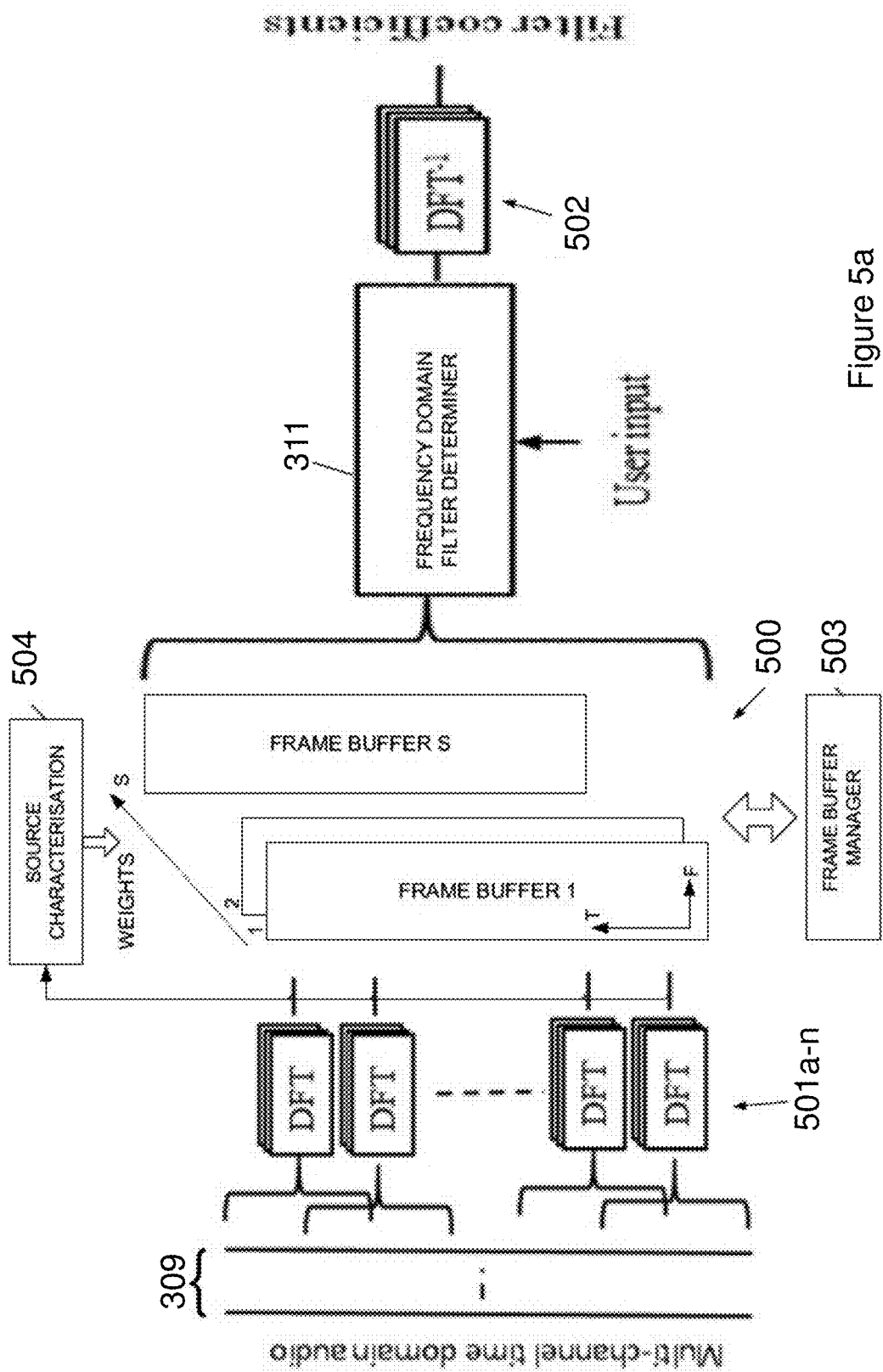
FIG. 5a illustratively shows an example frame buffer management implementation according to the present disclosure.

FIG. 5a shows an example implementation of frame buffer management according the present disclosure. FIG. 5 also illustrates time-frequency and frequency-time domain conversions (not shown in FIG. 2) for the frequency domain filter coefficient determiner 311 of FIG. 3c. In some implementations, each audio channel may be provided with an STFT (Short Time Fourier Transform) module 501a-n each configured to perform a succession of overlapping discrete Fourier transforms on an audio channel to generate a time sequence of spectra. Transformation of filter coefficients back into the time domain may be performed by a set of inverse discrete Fourier transforms 502.

The Discrete Fourier Transform (DFT) is a method of transforming a block of data between a time domain representation and a frequency domain representation. The STFT is an invertible method where overlapping time domain frames are transformed using the DFT to a time-frequency domain. The STFT is used to apply the filtering in the time-frequency domain; in embodiments when processing each audio channel, each channel in a frame is transformed independently using a DFT. Optionally the spatial filtering could also be applied in the time-frequency domain, but this incurs a processing latency and thus more preferably the filter coefficients are determined in the time-frequency domain and then inverse transformed back into the time domain. The time domain convolution maps to frequency domain multiplication.

As shown in FIG. 5a, a frame buffer system 500 is provided comprising a T×F frame buffer X for each microphone 1 . . . M. These store time-frequency data frames in association with frame weight/probability data as previously described. In embodiments the microphone STFT data are interleaved so that there is one frame buffer containing M×F×T STFT points. A frame buffer manager 503 operates under control of the procedure to read the stored weights for frame selection/weighting. In implementations, the frame buffer manager 503 also controls one or more pointers to identify one or more location(s) at which new (incoming) data is written into a buffer, for example to overwrite relatively less important frames with relatively more important frames. Optionally frame buffer system 500 may comprise two sets of frame buffers (for each microphone), one to accumulate new data whilst previously accumulated data from a second buffer is processed; then the second buffer can be updated. In embodiments a frame buffer may be relatively large—for example, single precision floating point STFT data at 16 kHz with 50% overlap between frames translates to ~8 MB of data per microphone per minute of frame buffer. However the system may accumulate new frames in a temporary buffer while calculating the filter coefficients and at the beginning of the next update cycle update the frame buffer from this temporary buffer (so that a complete duplicate frame buffer is not required).

The frame weights are determined by a source characterisation module 504. In implementations this determines frame weights according to one or more of the previously described heuristics. This may operate in the time domain or (more preferably) in the time-frequency domain as illustrated. More particularly, in implementations this may implement a multiple-source direction of arrival (DOA) estimation procedure. The skilled person will be aware of many suitable procedures including, for example, an MVDR (Minimum Variance Distortionless Response) beamformer, the MUSIC (Multiple Signal Classification) procedure, or a Fourier method (finding the peaks in the angular Fourier spectrum of the acoustic signals, obtained from a combination of the sensor array response and observations X).

The output data from such a procedure may comprise time series data indicating source activity (amplitude) and source direction. The time or time-frequency domain data or output of such a procedure may also be used to identify: a frame containing an impulsive event; and/or frames with less than a threshold sound level; and/or to classify a sound, for example as air conditioning or the like.

Figure 5B:
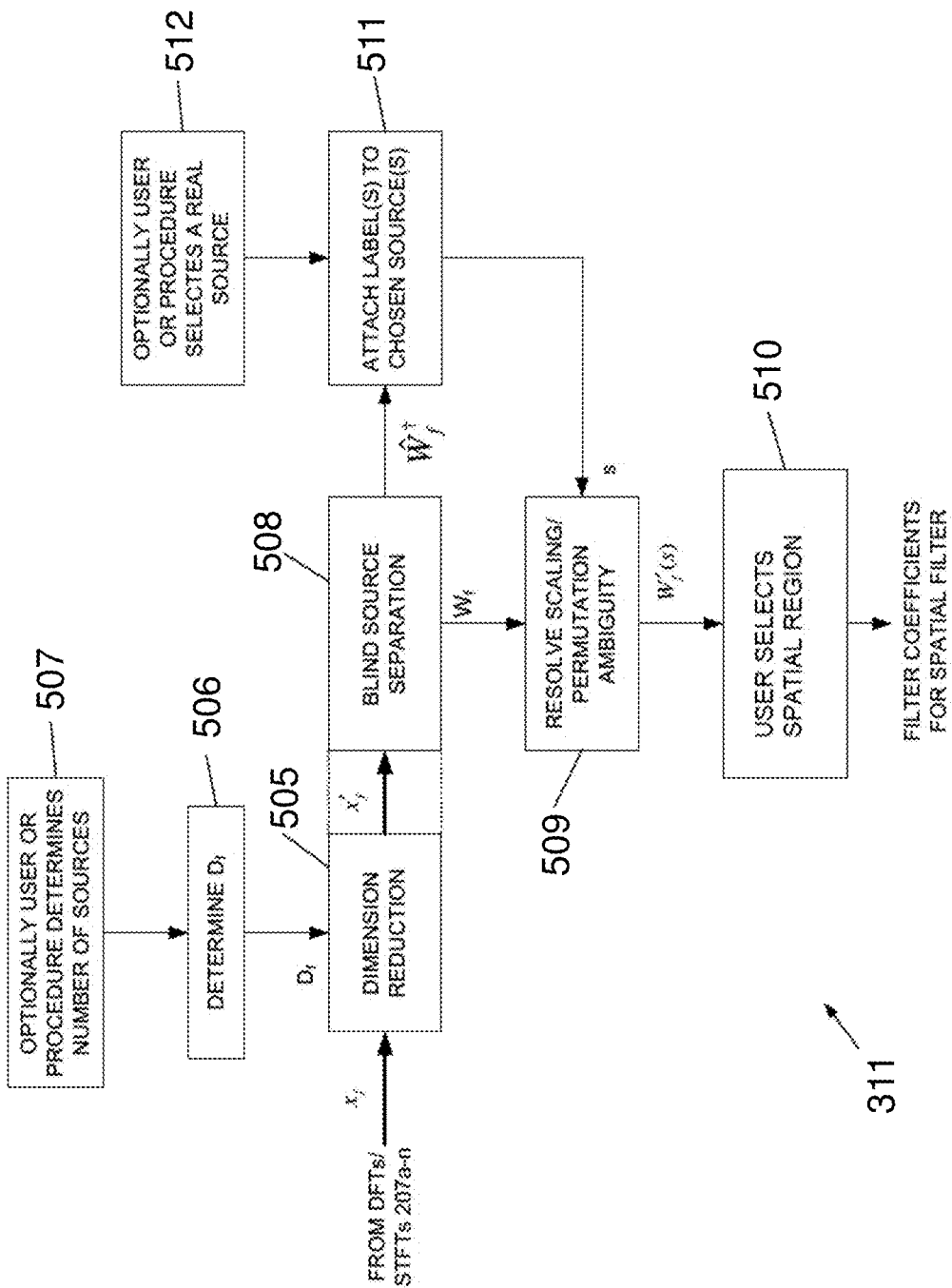
FIG. 5b illustratively shows an example implementation of a frequency domain filter coefficient determiner according to the present disclosure.

Referring now to FIG. 5b, this shows modules of an example implementation of a frequency domain filter coefficient determiner 311 for use in implementations of the disclosure. The modules of FIG. 5b operate according to the procedure as previously described. Thus the filter coefficient determination system receives digitised audio data from the multiple audio channels in a time-frequency representation, from the STFT modules 302a-n of FIG. 3c, defining the previously described observations xf. This is provided to an optional dimension reduction module 505 which reduces the effective number of audio channels according to a dimension reduction matrix Df. The dimension reduction matrix may be determined (module 506) either in response to user input defining the number of sources to demix or in response to a determination by the system of the number of sources to demix, step 507. The procedure may determine the number of sources based upon prior knowledge, or a DOA-type technique, or, for example, on some heuristic measure of the output or, say, based on user feedback on the quality of demixed output. In a simple implementation the dimension reduction matrix may simply discard some of the audio input channels but in other approaches the input channels can be mapped to a reduced number of channels, for example using PCA as previously outlined. The complete or reduced set of audio channels is provided to a blind source separation module 508 which implements a procedure as previously described to perform importance weighted/stochastic gradient-based blind source separation. As illustrated by the dashed lines, optionally dimension reduction may effectively be part of the blind source separation 508.

The blind source separation module 508 provides a set of demixing matrices as an output, defining frequency domain filter coefficients Wf. In embodiments these are provided to module 509 which removes the scaling ambiguity as previously described, providing filter coefficients for a source s at all the microphones (or reduced set of microphones).

The user selects 510 a spatial region as has been described above. In some implementations, this may comprise mapping the directions d in the visual representation on which the user has made their selection to the directions d for which the phase correlations $\Phi_f(S_{m_f}d)$ have been calculated. Thus, the user's selection in the visual representation corresponds to making a selection of directions d from the whole set of directions in the scene. With the selection of d now made, the probability of:

$$p_m(d_m \in \mathbb{D} r_{11} \ldots r_{NF}) = \Sigma_{d \in \mathbb{D}} p_m(s_d | r_{11} \ldots r_{NF})$$

may be calculated for each of the sources. The filter coefficients Wf(s) for selecting those sources that meet (for example exceed) the chosen probability threshold are then output by the filter determiner module for use by the spatial filter after conversion back into the time domain. When these coefficients are used by the spatial filter, this has the effect of removing (i.e. cropping) those components of the input audio signal that are from sources outside the selected spatial region.

In some implementations, if a priori knowledge of the source directions is available, an additional layer of user selection may optionally be introduced by a source selection module 511 that operates on a pseudo inverse of the demixing matrix, using the microphone phase responses to choose a specific source s based on that a priori knowledge. That is, the source may be selected 512 either by the user, for example the user indicating a direction of the desired source, based on said a priori knowledge of the source direction.

Figure 6:
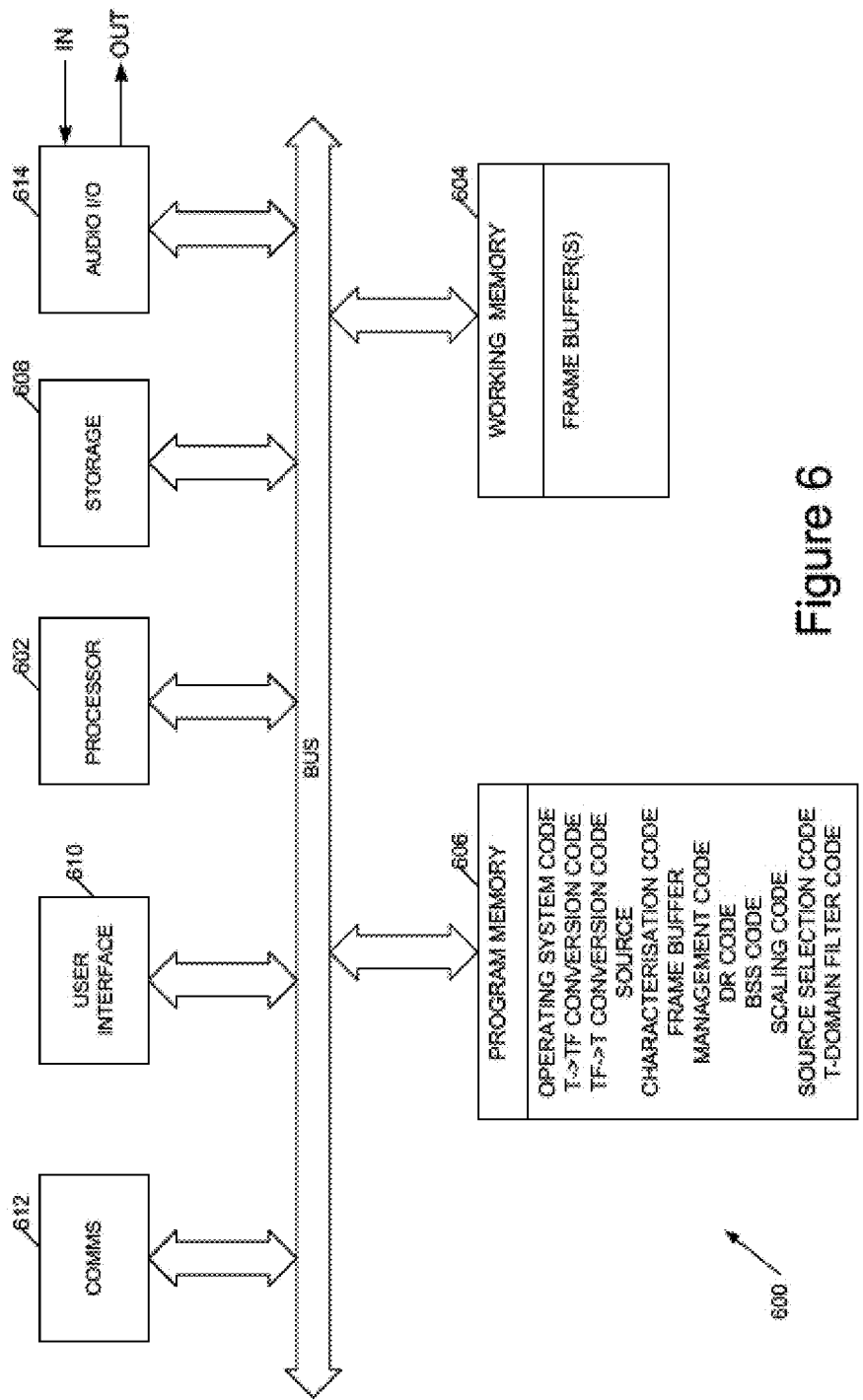
FIG. 6 illustratively shows an example of a general purpose computing system programmed to implement an audio-visual system of the present disclosure.

FIG. 6 shows an example of a general purpose computing system 600 programmed to implement a system as described above to improve audibility of an audio signal by blind source separation according to an embodiment of the invention. Thus the computing system comprises a processor 602, coupled to working memory 604, program memory 606, and to storage 608, such as a hard disk. Program memory 606 comprises code to implement embodiments of the invention, for example operating system code, time to frequency domain conversion code, frequency to time domain conversion code, source characterisation code, frame buffer management code, (optional) dimension reduction code, blind source separation code, scaling/permutation code, source selection code, and spatial (time domain) filter code. Working memory 604/storage 608 stores data for the above-described procedure, and also implements the frame buffer(s). Processor 602 is also coupled to a user interface 612, to a network/communications interface 612, and to an (analogue or digital) audio data input/output module 614. The skilled person will recognise that audio module 614 is optional since the audio data may alternatively be obtained, for example, via network/communications interface 612 or from storage 608.

Figure 7:
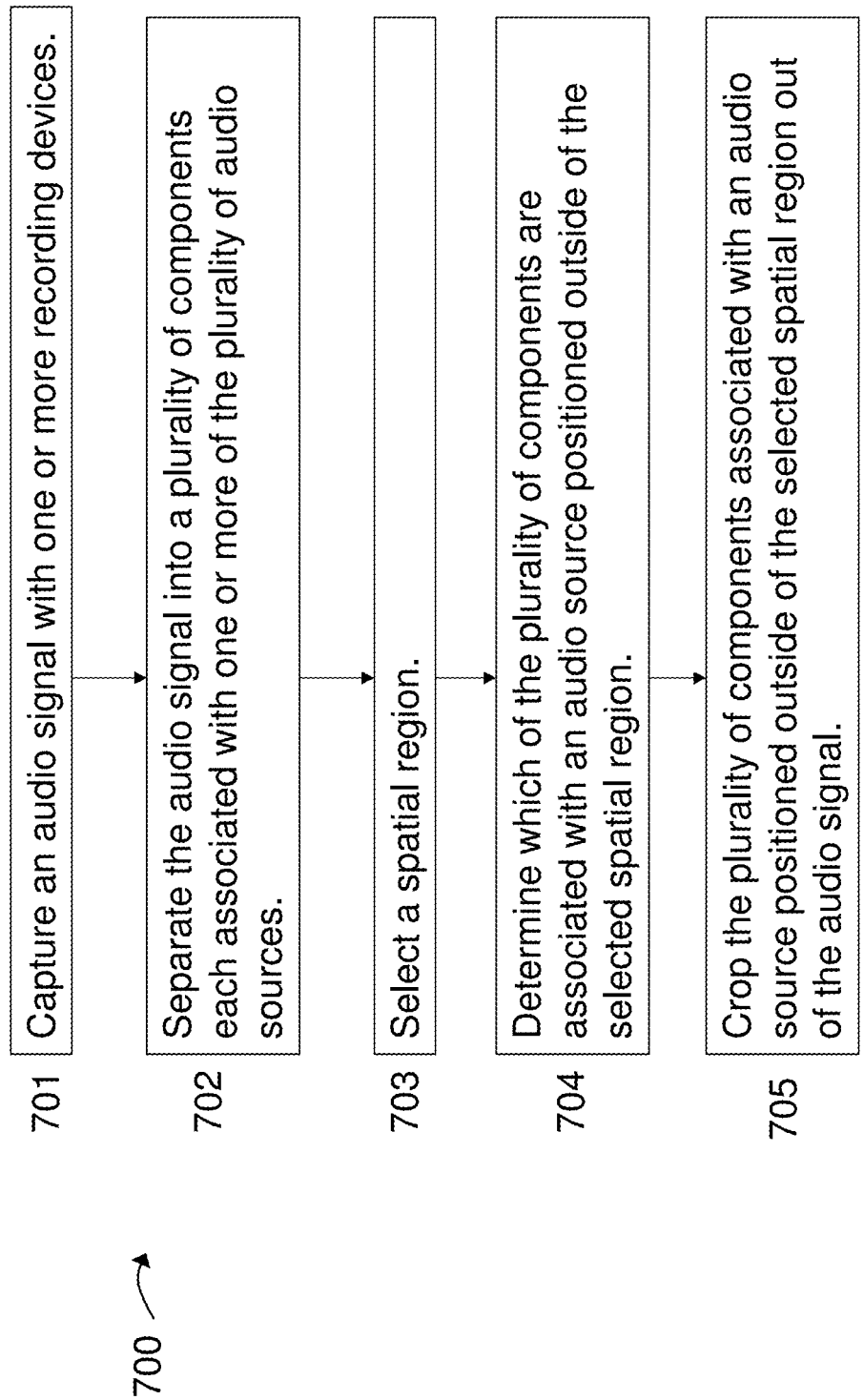
FIG. 7 is a flowchart of a method according to the present disclosure.

FIG. 7 is a flowchart of steps for performing a method 700 according to the present disclosure. The method 700 comprises: capturing 701 the audio signal with one or more recording devices; separating 702 the audio signal into a plurality of components component associated with one of the plurality of audio sources; selecting 703 a spatial region in the scene; determining 704 which of the plurality of components are associated with an audio source positioned outside of the selected spatial region; and cropping 705 the plurality of components associated with an audio source positioned outside of the selected spatial region out of the audio signal.

No doubt many other effective alternatives will occur to the skilled person. It will be understood that the invention is not limited to the described embodiments and encompasses modifications apparent to those skilled in the art lying within the scope of the claims appended hereto. It should further be noted that the invention also encompasses any combination of embodiments described herein, for example an embodiment may combine the features of any one or more of the independent and/or dependent claims.

For example, where it the audio signal is described as being separated into a plurality of components associated with one or more of the plurality of audio sources, it is envisaged that in an ideal situation, there may be a one-to-one correspondence whereby each of the plurality of components is associated with one of the audio sources. However, in practice, for example if the scene is more complex and contains many audio sources, BSS may be unable to distinguish the sources perfectly and inadvertently merge sources and thus it is also envisaged that in some scenarios, each component may be associated with multiple sources.

Finally, in some cases, for example where there are not many audio sources, some of the components may mostly contain ambient noise.

For example, the audio and/or video cropping may occur in real time or near real time as the audio and/or video data is being recorded by or streamed to the user device or it instead may performed after the recording has taken place as part of an editing process.

The invention claimed is:

1. A method of cropping a portion of an audio signal captured from a plurality of spatially separated audio sources in a scene, the method comprising:
capturing the audio signal with one or more recording devices, the audio signal captured with each of the one or more recording devices, the audio signal comprising a plurality of components, each of the plurality of components associated with a respective one of the plurality of spatially separated audio sources;
separating the audio signal into the plurality of components;
selecting a spatial region in the scene;
determining which of the plurality of components are associated with an audio source positioned outside of the selected spatial region, the determining comprising for each of the plurality of components:
calculating phase correlations across a set of possible directions of arrival of the component at the one or more recording devices;
calculating a probability of observing the calculated phase correlations; and
determining the audio source is outside of the selected spatial region when the calculated probability is below a threshold, and/or
determining the audio source is inside the of the selected spatial region when the calculated probability is at or above the threshold; and
cropping the plurality of components associated with an audio source positioned outside of the selected spatial region out of the audio signal.

2. The method of claim 1, wherein selecting the spatial region in the scene comprises:
on a display of a user device, displaying a spatial representation of the scene; and
with a user interface of the user device, selecting the spatial region on the displayed spatial representation.

3. The method of claim 2, comprising:
with an image capture device, capturing image data of the scene, and
constructing the spatial representation of the scene from the captured image data.

4. The method of claim 1, wherein separating the audio signal into a plurality of components comprises performing blind source separation on the captured audio signal.

5. The method of claim 4, wherein performing the blind source separation comprises:
converting the captured audio signal to time-frequency domain data comprising a plurality of frames for a plurality of times and frequencies, and
constructing a multi-channel filter to operate on the time-frequency data frames to separate the plurality of components by source by calculating a set of filter coefficients corresponding to each source.

6. The method of claim 5 wherein the cropping comprises selecting and applying the set of filter coefficients of the multi-channel filter corresponding to those sources determined to be inside of the selected spatial region.

7. The method of claim 1, wherein calculating the probability of observing the calculated phase correlations comprises:
ranking the phase correlations, and
comparing the rankings to rankings of phase correlations in training data.

8. The method of claim 3, wherein the set of possible directions of arrival comprises a set of vectors in a 3D coordinate system of the spatial representation of the scene.

9. The method of claim 1, wherein calculating the probability of observing the calculated phase correlations comprises calculating:

$$p_m(d_m \in \mathbb{D} | r_{11} \ldots r_{NF})$$

where, for each component associated with an audio source m, $p_m$ is the probability that d, a direction in a 3D coordinate system of the scene indicating a direction of arrival of the component at the one or more recording devices, is an element of the set $\mathbb{D}$, the set of directions in the selected spatial region, given the phase correlation rank $r_{11} \ldots r_{NF}$ of the direction d over N directions over F frequencies.

10. The method of claim 5, comprising calculating the phase correlations using a phase transformation method.

11. The method of claim 10, wherein the phase transformation method comprises a steered response power phase transformation (SRP-PHAT) method.

12. The method of claim 3, comprising cropping out of the image data regions outside of the selected spatial region.

13. The method of claim 1, further comprising:
recognizing in the cropped audio signal a speech component;
isolating the speech component; and
outputting with a playback device the speech component.

14. The method of claim 1, comprising:
identifying in the cropped audio signal the component of the plurality of components having the highest volume, and
outputting with a playback device the component having the highest volume.

15. An audio-visual system comprising:
one or more recording devices configured to capture an audio signal from a plurality of spatially separated audio sources in a scene, the audio comprising a plurality of components, each of the plurality of components associated with a respective one of the plurality of spatially separated audio sources;
a user device comprising a display configured to display a spatial representation of the scene and a user interface for selecting a spatial region on the displayed spatial representation; and
one or more processors configured to:
separate the audio signal into the plurality of components;
determine which of the plurality of components are associated with an audio source positioned outside of the spatial region selected with the user interface by, for each of the plurality of components:
calculating phase correlations across a set of possible directions of arrival of the component at the one or more recording devices;
calculating a probability of observing the calculated phase correlations; and
determining the audio source is outside of the selected spatial region when the calculated probability is below a threshold, and/or determining the audio source is inside the of the selected spatial region when the calculated probability is at or above the threshold; and crop the plurality of components associated with an audio source positioned outside of the selected spatial region out of the audio signal.

16. The audio-visual system of claim 15, wherein the user device comprises the one or more recording devices.

17. The audio-visual system of claim 15, comprising one or more image capture devices configured to capture image data of the scene, wherein the one or more processors are configured to construct the spatial representation of the scene from the captured image data.

18. The audio-visual system of claim 17, wherein the user device comprises the one or more image capture devices.

19. The audio-visual system of claim 17, wherein the one or more processors are configured to crop out of the captured image data of the scene regions outside of the selected spatial region.

20. The audio-visual system of claim 19, comprising one or more playback devices configured to output the cropped audio signal and the cropped image data.

21. The audio-visual system of claim 15, wherein the user device is mobile device.

22. The audio-visual system of claim 15, wherein the audio-visual system comprises a video teleconferencing system.

\* \* \* \* \*